US011271490B1

(12) United States Patent
Vinciarelli

(10) Patent No.: US 11,271,490 B1
(45) Date of Patent: Mar. 8, 2022

(54) MULTI-CELL POWER CONVERTER

(71) Applicant: Vicor Corporation, Andover, MA (US)

(72) Inventor: Patrizio Vinciarelli, Boston, MA (US)

(73) Assignee: Vicor Corporation, Andover, MA (US)

( * ) Notice: Subject to any disclaimer, the term of this patent is extended or adjusted under 35 U.S.C. 154(b) by 307 days.

(21) Appl. No.: 16/535,480

(22) Filed: Aug. 8, 2019

Related U.S. Application Data

(60) Provisional application No. 62/879,958, filed on Jul. 29, 2019.

(51) Int. Cl.
| | | |
|---|---|---|
| *H01F 27/28* | (2006.01) | |
| *H02M 7/00* | (2006.01) | |
| *H05K 1/16* | (2006.01) | |
| *H01F 27/40* | (2006.01) | |
| *H05K 1/18* | (2006.01) | |

(52) U.S. Cl.
CPC ........ *H02M 7/003* (2013.01); *H01F 27/2804* (2013.01); *H01F 27/40* (2013.01); *H05K 1/165* (2013.01); *H01F 2027/2809* (2013.01); *H05K 1/18* (2013.01); *H05K 2201/08* (2013.01); *H05K 2201/10015* (2013.01); *H05K 2201/10053* (2013.01)

(58) Field of Classification Search
CPC ................. H02M 7/003; H05K 1/165; H05K 2201/10053; H05K 2201/10015; H05K 1/18; H05K 2201/08; H01F 27/2804; H01F 2027/2809
USPC ....................................................... 361/811
See application file for complete search history.

(56) References Cited

U.S. PATENT DOCUMENTS

| | | | |
|---|---|---|---|
| 4,665,357 A | 5/1987 | Herbert | |
| 4,845,606 A | 7/1989 | Herbert | |
| 4,916,576 A | 4/1990 | Herbert | |
| 6,820,321 B2 | 11/2004 | Harding | |
| 6,930,893 B2 | 8/2005 | Vinciarelli | |
| 6,975,098 B2 | 12/2005 | Vinciarelli | |
| 6,984,965 B2 | 1/2006 | Vinciarelli | |
| 7,145,786 B2 | 12/2006 | Vinciarelli | |
| 7,187,263 B2* | 3/2007 | Vinciarelli | .......... H01F 27/2804 336/200 |
| 8,203,418 B2 | 6/2012 | Harrison et al. | |
| 8,772,909 B1* | 7/2014 | Vinciarelli | .......... H01F 27/2804 257/531 |
| 9,166,481 B1 | 10/2015 | Vinciarelli et al. | |
| 9,508,485 B1* | 11/2016 | Vinciarelli | .......... H04L 25/0266 |
| 9,516,761 B2 | 12/2016 | Vinciarelli et al. | |
| 10,014,798 B1 | 7/2018 | Vinciarelli | |
| 10,158,357 B1 | 12/2018 | Vinciarelli et al. | |
| 10,264,664 B1 | 4/2019 | Vinciarelli et al. | |

(Continued)

OTHER PUBLICATIONS

Herbert, "Design and Application of Matrix Transformers and Symmetrical Converters," a tutorial presented at the High Frequency Power Conversion Conference, 1990, 174 pages.

*Primary Examiner* — Sherman Ng
(74) *Attorney, Agent, or Firm* — Fish & Richardson P.C.

(57) ABSTRACT

An improved distributed-output multi-cell-element power converter utilizes a multiplicity of magnetic core elements, switching elements, capacitor elements and terminal connections in a step and repeat pattern. Stepped secondary-winding elements reduce converter output resistance and improve converter efficiency and scalability to support the high current requirements of very large scale integrated ("VLSI") circuits.

76 Claims, 12 Drawing Sheets

(56) References Cited

U.S. PATENT DOCUMENTS

| | | | |
|---|---|---|---|
| 10,277,105 B1 | 4/2019 | Vinciarelli et al. | |
| 2005/0270745 A1* | 12/2005 | Chen | H01F 27/2804 |
| | | | 361/707 |
| 2006/0086981 A1* | 4/2006 | Yamaguchi | H02M 7/003 |
| | | | 257/347 |
| 2013/0187737 A1* | 7/2013 | Li | H01F 5/00 |
| | | | 336/5 |
| 2013/0249659 A1* | 9/2013 | Tseng | H01F 27/06 |
| | | | 336/65 |
| 2014/0266546 A1* | 9/2014 | Mao | H01F 41/046 |
| | | | 336/200 |
| 2016/0086723 A1* | 3/2016 | Su | H01F 17/0033 |
| | | | 336/200 |

\* cited by examiner

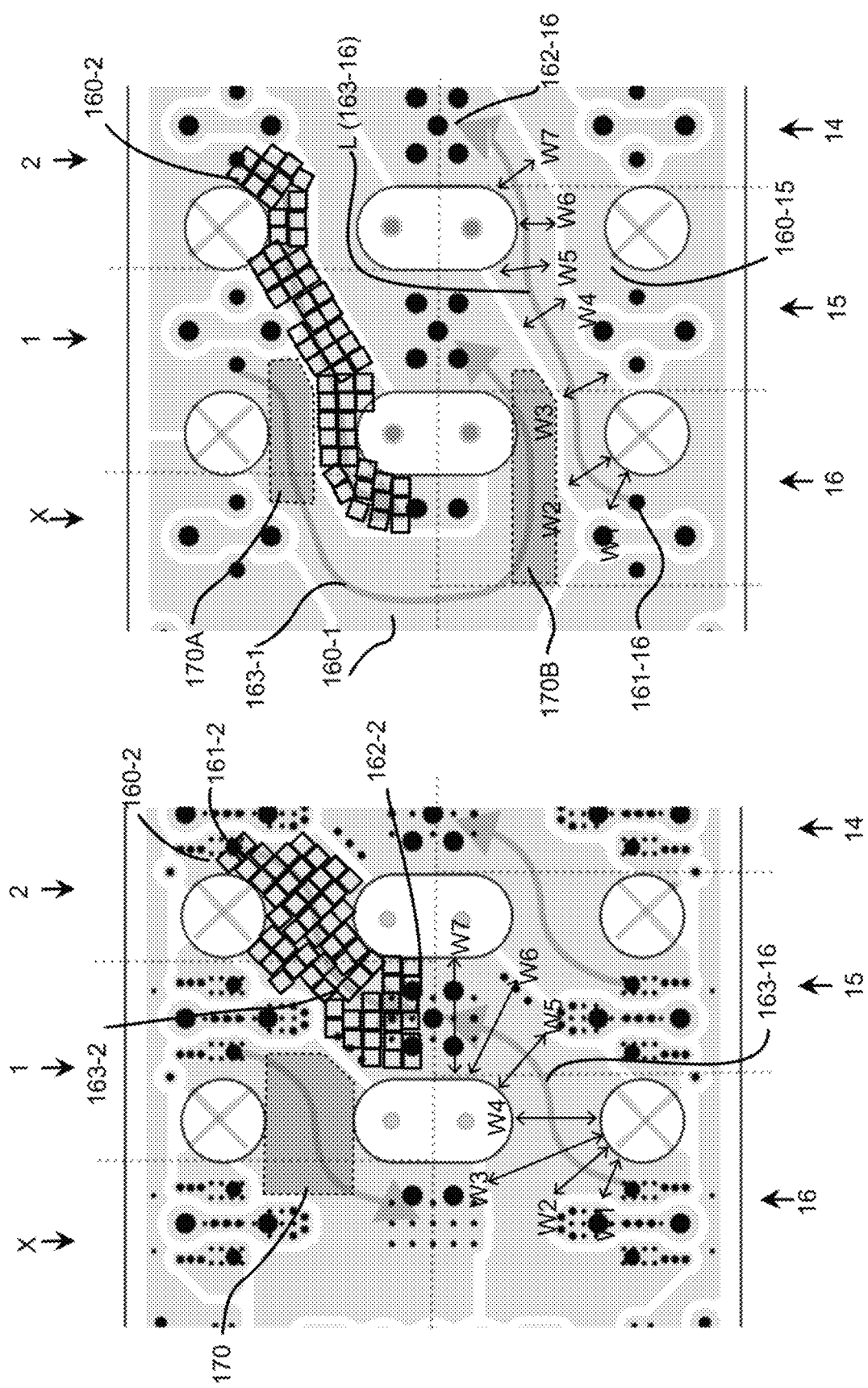

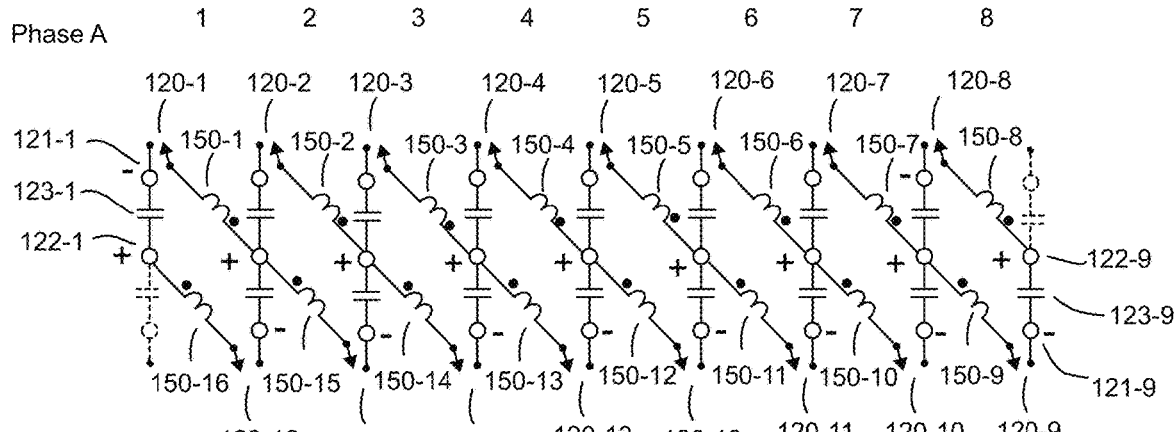
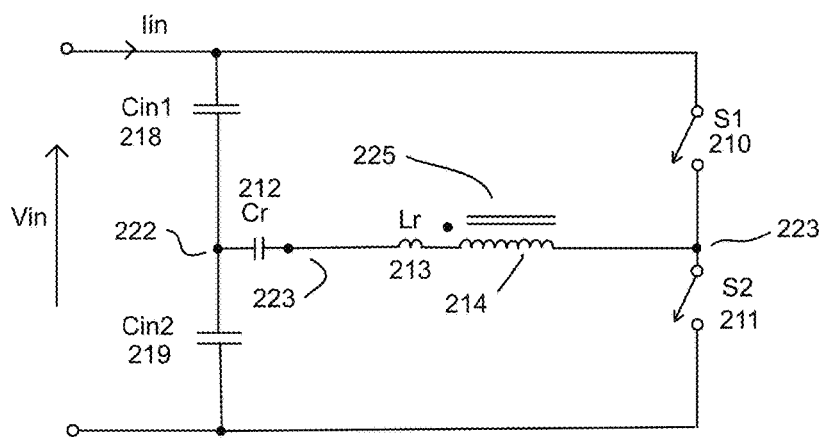
Fig. 16
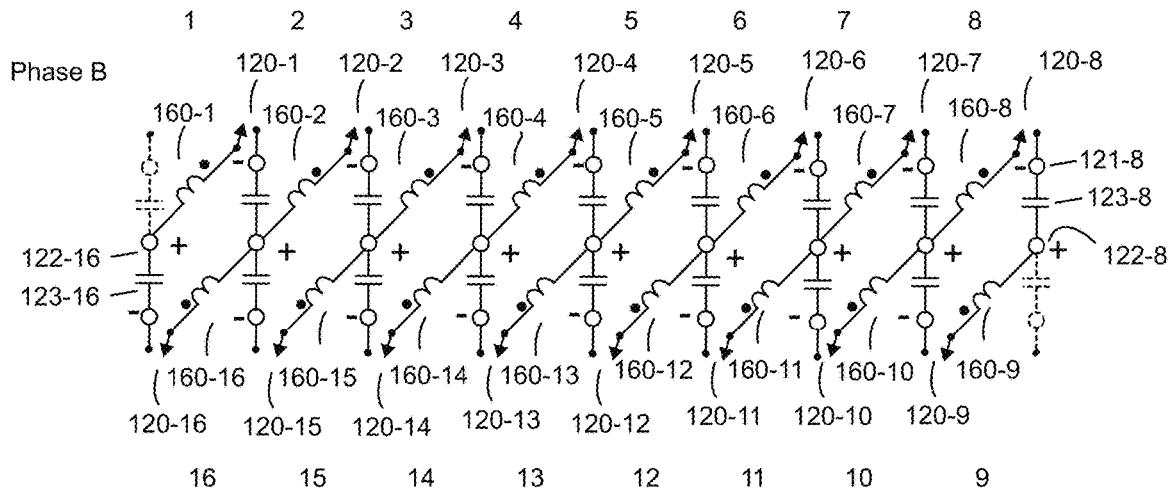

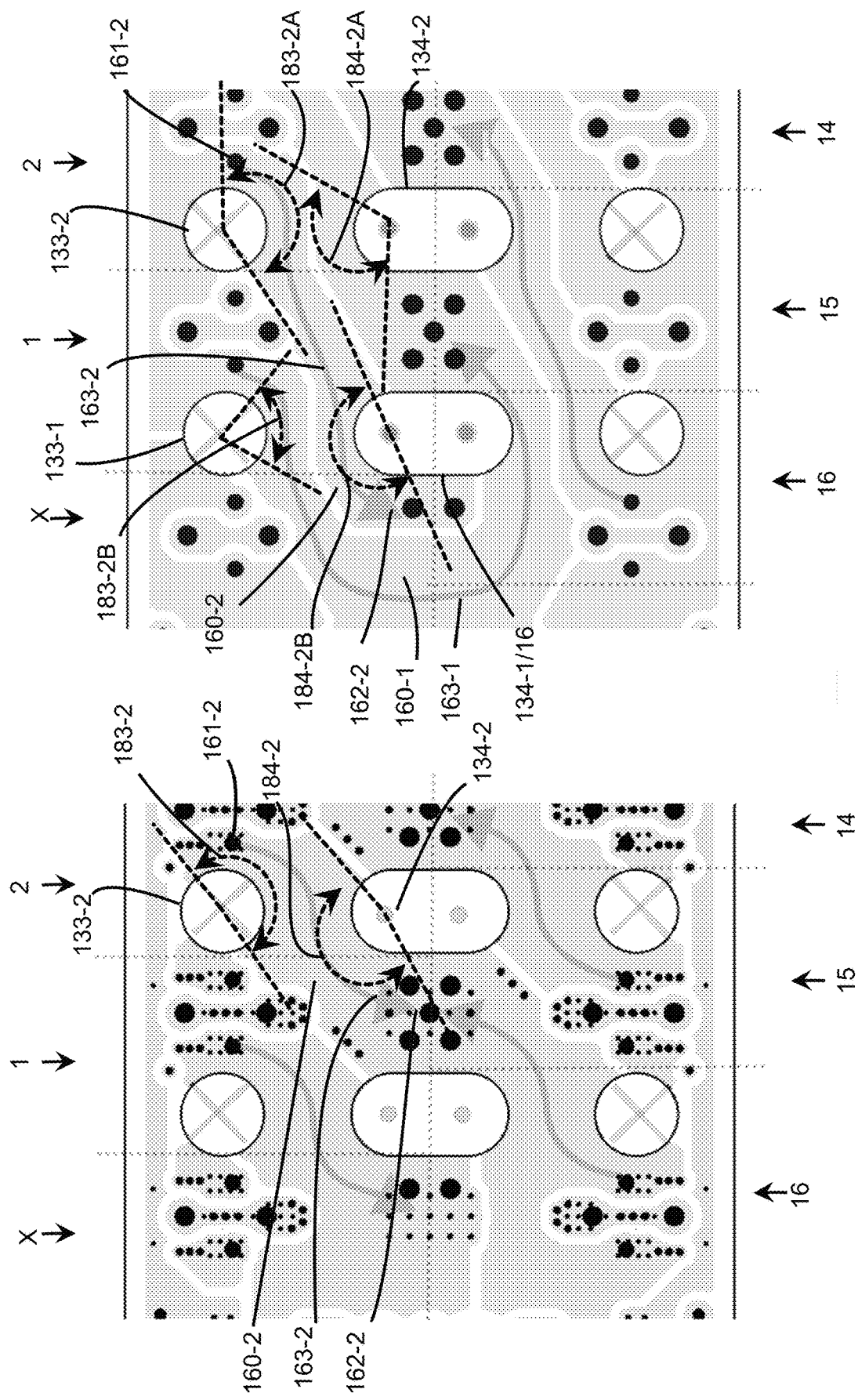

MULTI-CELL POWER CONVERTER

CROSS-REFERENCE TO RELATED APPLICATION

This application claims priority to U.S. provisional patent application 62/879,958, filed on Jul. 29, 2019, the entire content of which is incorporated by reference.

FIELD OF THE INVENTION

This invention relates to the field of power conversion, and more specifically to multi-cell power converters.

BACKGROUND

In contemporary electronic systems, space is at a premium on customer circuit boards, e.g. on a circuit board near a processor. Additionally, efficiency and thermal management considerations place limits on the power dissipation of power supplies at, or near, the point of load. As feature sizes decrease and transistor counts increase, so too do the power supply current requirements for very large scale integrated ("VLSI") semiconductor dies such as central processing units ("CPU"), graphics processing units ("GPU"), and application specific integrated circuits ("ASIC"). Current requirements for certain CPUs exceed 200 amps at 1.8V and for advanced GPUs 500 amps at less than 1V, creating challenges to supply such high currents in the space allocated.

Matrix transformer structures are described in E. Herbert, *Design and Application of Matrix Transformers and Symmetrical Converters*, Fifth International High Frequency Power Conversion Conference '90, Santa Clara, Calif. May 11, 1990; Herbert, Flat Matrix Transformer, U.S. Pat. No. 4,665,357 issued May 12, 1987; and Herbert, High Frequency Matrix Transformer, U.S. Pat. No. 4,845,606 issued Jul. 4, 1989.

The following disclosure describes advancements in power converter output and winding structures to improve converter performance.

SUMMARY

In general, in one aspect, an apparatus includes a power converter having a distributed output structure. The power converter may have a multi-layer printed circuit board ("PCB") including first and second conductive layers separated by insulation layers. A magnetically permeable core structure may include a number, Np, of magnetic paths, each passing through the first and second conductive layers in at least two leg locations. A first winding may have a first winding element formed in the first conductive layer that passes through the Np magnetic paths between the respective leg locations. A plurality of second winding elements may be formed in the second conductive layer. Each second winding element may pass through a subset of the magnetic paths between the respective leg locations. Each subset includes a number, $N_S$, of the magnetic paths. A plurality of cell elements may each include a respective second winding element, a switch, and a capacitor.

The above general aspect may include one or more of the following features. (1) The second winding elements of each cell element may have a first end connected to a terminal of the switch in the cell element and a second end connected to an output terminal in a neighboring cell element with the second winding elements in neighboring cell elements stepping through the magnetic paths in the same direction. (2) The second winding elements in cell elements not located at an end of the converter may have a length measured between a first termination connected to the switch on one side of the output cell and a second termination connected to an output terminal located on an opposite side of the output cell that encircles less than half of the respective core leg in the second conductive layer. (3) The product of $N_S$ times the length, $L_S$, divided by the average width, $W_S$, of the second winding element between the first and second terminations may be less than a number, S, where S is less than or equal to 6. (4) The converter may have a specific output resistance divided by the number $N_S$ that is less than or equal to 90 mΩ mm$^2$ based upon area or less than or equal to 200 mΩ mm$^3$ based upon volume.

In general, in another aspect, a power converter with a distributed output structure may include a multi-layer printed circuit board ("PCB") including first and second conductive layers separated by an insulation layer. A magnetically permeable E-core structure having a number, Np, of magnetic paths, each passing through the first and second conductive layers in at least two leg locations. The magnetic paths may be arranged in a first set and a second set, each set forming a winding tunnel through the magnetic paths between the respective leg locations, with the first set forming the first winding tunnel and the second set forming the second winding tunnel generally parallel to the first winding tunnel. A first conductive winding in the first conductive layer may have a first winding element passing through the first winding tunnel through the first set of magnetic paths in a first direction and through the second winding tunnel through the second set of magnetic paths in a direction opposite the first direction. A plurality of second winding elements in the second conductive layer may each pass through a respective subset of the magnetic paths between the respective leg locations. Each subset may include a number, $N_S$, of the magnetic paths. A plurality of interconnected converter output cell elements may each include a respective second winding, a switch, and a capacitor. The second winding element of each cell element may have a first end connected to a terminal of the switch in the cell element and a second end connected to an output terminal in a neighboring cell element. The second winding elements in neighboring cell elements may step through the respective subsets of magnetic paths in the same direction.

In general, in another aspect, a power converter with a distributed output structure may include a multi-layer printed circuit board ("PCB") including first and second conductive layers separated by an insulation layer. A magnetically permeable core structure may include a number, Np, of magnetic paths, each passing through the first and second conductive layers in at least two leg locations. A number, X, of first windings may each include a respective first winding element that passes through a respective subset of the magnetic paths between the respective leg locations. Each respective subset may include a respective number, Npx, of the magnetic paths. At least one of the first winding elements may be formed in the first conductive layer of the PCB. A plurality of second winding elements may be formed in the second conductive layer. Each second winding element may pass through a subset of the magnetic paths between the respective leg locations. Each subset may include a number, $N_S$, of the magnetic paths. A plurality of cell elements may each include a respective second winding element, a switch, and a capacitor. The respective second winding element of each cell element may have a first end connected to a terminal of the switch in the cell element and a second end connected to an output terminal in a neighboring cell element. The second winding elements in neighboring cell elements may step through the respective subsets of magnetic paths in the same direction. The cell elements may be arranged in two or more groups with each group of elements connected to support a respective converter output.

Implementations of the above aspects may include one or more of the following features. The cell elements may be physically arranged in a step and repeat pattern. The cell elements may be connected to form one or more circular circuits. The Np magnetic paths may be arranged in pairs, each sharing a center leg as one of the leg locations. The number $N_S$ may equal 1 or 2. The output cell elements may be arranged in a number of rows. The number of rows may equal two. Each row may include an equal number of output cell elements. The output terminals of the elements in one row may be shared with the output terminals of the elements in the other row. The output cell elements may be constructed and arranged with adjacent cells having interleaved magnetic paths, output terminals and/or switches. The apparatus of claim 12 wherein the number $N_S$ equals one, and the number S is less than or equal to 5. The number S may be less than or equal to 5 or 4. The converter may have a specific winding resistance divided by $N_S$ that is less than or equal to 35 mΩ mm$^2$ based upon area or less than or equal to 80 mΩ mm$^3$ based upon volume. The converter may have a specific winding resistance divided by $N_S$ that is less than or equal to 30 mΩ mm$^2$ based upon area or less than or equal to 70 mΩ mm$^3$ based upon volume. The converter may have a specific output resistance divided by $N_S$ that is less than or equal to 60 mΩ mm$^2$ based upon area or less than or equal to 140 mΩ mm$^3$ based upon volume. Each magnetic path may surround a number of secondary winding elements in the second conductive layer and the number may be one, two, or equal to $N_S$. A number, X, of first windings each including a respective first winding element that passes through a respective subset of the magnetic paths between the respective leg locations may be provided and each respective subset may include a respective number, Npx, of the magnetic paths. The cell elements are arranged in two or more groups, each group connected to support a respective converter output. The number $N_S$ may equal 1 for the cell elements in a first group and may equal 2 for the cell elements in a second group. The groups of cell elements may be partitioned by row, by column, or across rows and columns.

BRIEF DESCRIPTION OF DRAWINGS

FIG. 14 shows dimensional details of the second phase one-step secondary winding element of FIG. 10.

FIG. 15 shows dimensional details of the second phase two-step secondary winding element of FIG. 11.

FIG. 16 shows a schematic diagram of the distributed output power converter with one-step secondary windings.

FIG. 17 shows a second phase one-step secondary winding element.

FIG. 18 shows a second phase two-step secondary winding element.

Like reference numbers and symbols in the various drawings indicate like elements.

DETAILED DESCRIPTION

Figure 1:
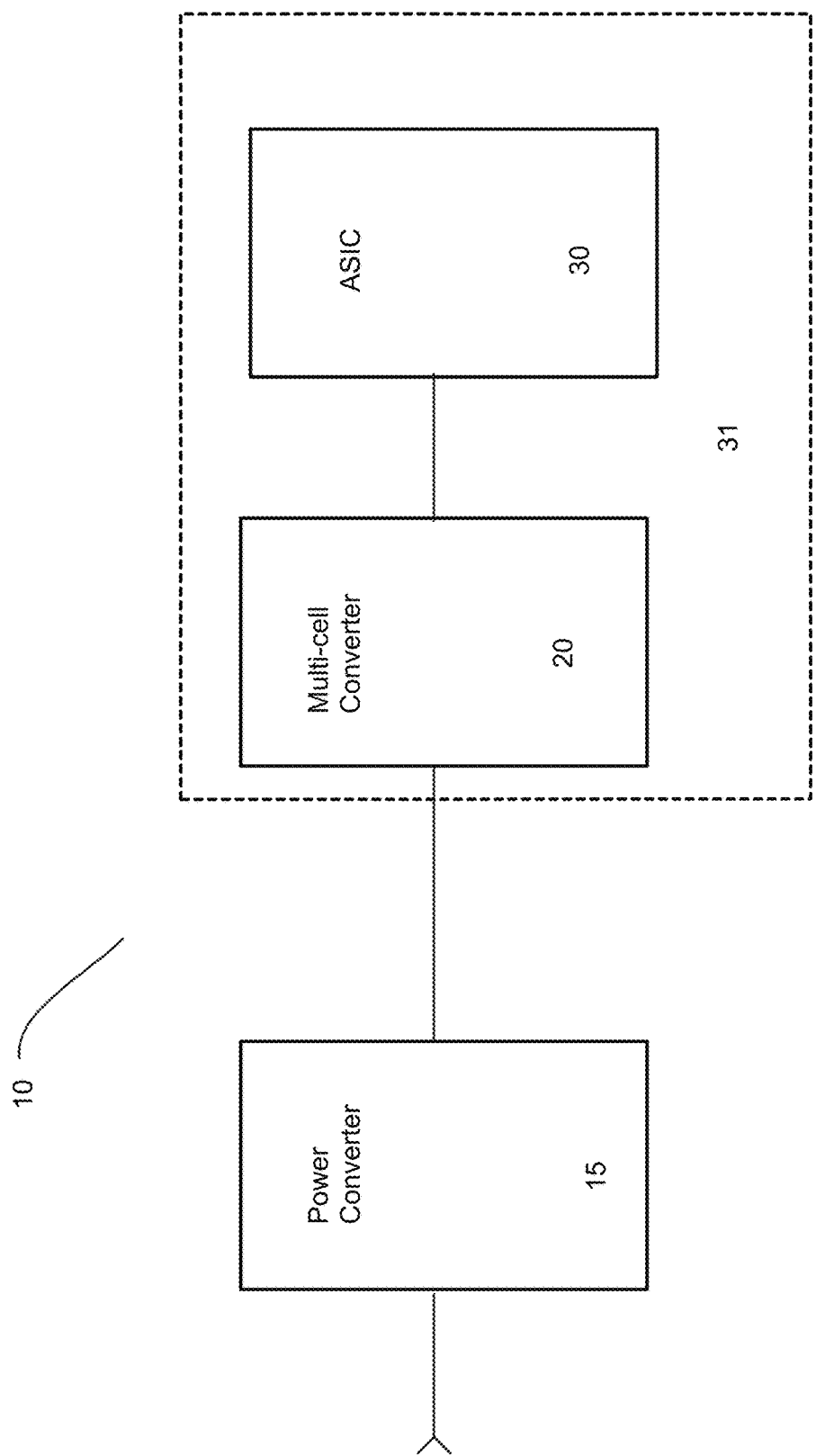
FIG. 1 shows a block diagram of a system for powering a semiconductor load such as a CPU, GPU, ASIC, or other high current demanding load.

A Factorized Power Architecture well suited for supplying power to low voltage high current loads is described in Vinciarelli, Factorized Power with Point of Load Sine Amplitude Converters, U.S. Pat. No. 6,975,098, issued Dec. 13, 2005 (the "Micro FPA Patent") and U.S. Pat. No. 6,984,965, issued Jan. 10, 2006 (the "FPA Patent") (both assigned to VLT, Inc. of Andover, Mass., and the entire disclosure of each patent is incorporated herein by reference). Power converters which function as DC-to-DC transformers called Voltage Transformation Modules ("VTM") and Sine Amplitude Converters ("SAC") which have a transfer function approximating $Vo = K_{VTM}*Vin - Io*R_{VTM}$ (i.e., fixed-ratio converters) are described in Vinciarelli, Factorized Power with Point of Load Sine Amplitude Converters, U.S. Pat. No. 6,930,893, issued Aug. 16, 2005 (the "SAC Patent") and in Vinciarelli, Point of Load Sine Amplitude Converters and Methods, U.S. Pat. No. 7,145,786, issued Dec. 5, 2006 (the "POL SAC Patent") (collectively the "SAC Patents") (both of which are assigned to VLT, Inc. of Andover, Mass., and the entire disclosure of each is incorporated herein by reference). The SAC Patents describe a two-cell SAC structure in connection with FIGS. 33 and 40 which may be connected in parallel to provide greater output power.

Subsequent developments of in-package and on-package multi-cell power conversion topologies developed to meet the challenges of delivering high currents in typically small spaces for powering semiconductor loads are described in Vinciarelli, Driver and Output Circuit for Powering Semiconductor Loads, U.S. Pat. No. 10,014,798 issued Jul. 3, 2018, (the "Remote Driver Patent"); in Vinciarelli et al., Method and Apparatus for Delivering Power to Semiconductors, U.S. Pat. No. 10,158,357 issued Dec. 18, 2018 (the "MCM Patent"); and in U.S. Pat. No. 10,277,105 issued Apr. 30, 2019 (the "Multi-Rail Patent") (collectively the "PoP Patents") all of which are assigned to VLT, Inc. of Andover, Mass., and the entire disclosure of each is incorporated herein by reference. Additional packaging developments for power converters are described in Vinciarelli et al., Panel Molded Electronic Assemblies with Multi-Surface Contacts, U.S. Pat. No. 10,264,664 issued Apr. 16, 2019 (the "Leadless Patent") and in Vinciarelli, Panel Molded Electronic Assemblies with Integral Terminals, U.S. Ser. No. 16/218,395, filed on Dec. 12, 2018, issued as U.S. Pat. No. 10,785,871 on Sep. 22, 2020 (the "Trench Disclosure") (both of which are assigned to VLT, Inc. of Andover, Mass., and incorporated herein in its entirety by reference). A multi-cell power converter for deployment at the POL which leverages the foregoing advances and includes additional packaging and interconnection developments is described in Vinciarelli, Delivering Power to Semiconductor Loads, U.S. Ser. No. 16/218,418, filed on Dec. 12, 2018, issued as U.S. Pat. No. 10,903,734 on Jan. 26, 2021 (the "GB Disclosure") (assigned to VLT, Inc. of Andover, Mass., the entire disclosure of which is incorporated herein by reference).

The power converters as described in the above disclosures generally use a plurality of self-contained output cells in which the secondary windings comprise an essentially complete "turn" surrounding a respective core leg and generally correlate to the secondary winding configuration shown in Vinciarelli, Printed Circuit Transformer, U.S. Pat. No. 7,187,263 issued Mar. 6, 2007 (the "Racetrack" patent) (assigned to VLT, Inc. of Andover, Mass., and incorporated by reference in its entirety here). The self-contained output cells are described in more detail below in connection with FIGS. 2 and 3.

A schematic block diagram of a preferred system 10 for powering a semiconductor load, such as a high-power ASIC, is shown in FIG. 1 (which is a reproduction of FIG. 1 from the GB Disclosure) including a first (preferably switching) power converter 15 connected to convert power received from a source, e.g. a system power bus, (not shown) for delivery (preferably at or near 48 Volts DC) to a second stage converter 20 which converts power for delivery at the low voltage required by the semiconductor, e.g. typically ranging from less than 2 VDC to less than 1 VDC to the semiconductor load, e.g. ASIC 30. As shown the second stage converter 20 is preferably a multi-cell preferably fixed-ratio switching converter mounted in close proximity to the point of load ("PoL"), for example on or in the same package or assembly, e.g. assembly 31, as the ASIC 30.

Figure 2:
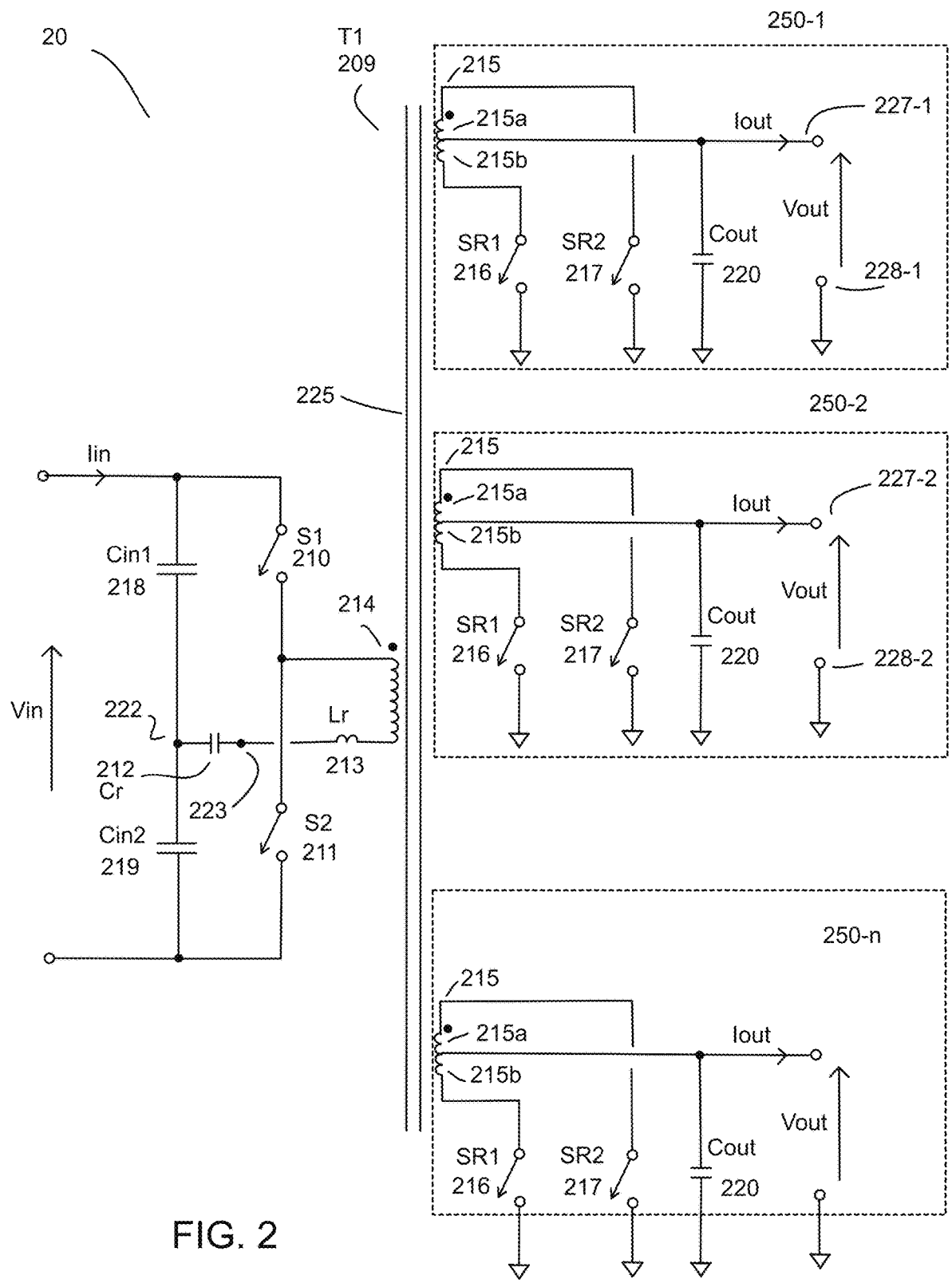
FIG. 2 shows a schematic diagram of a multi-cell converter.

Referring to FIG. 2 (which is a reproduction of FIG. 2 from the GB Disclosure), a schematic diagram of a multi self-contained output-cell fixed-ratio converter adapted for use as the second stage converter 20 is shown having a single half-bridge input circuit to drive the primary winding 214 of transformer T1 209 with power received at the input voltage Vin. A plurality of self-contained output cells 250-1, 250-2, 250-n are shown having respective secondary windings 215 coupled to the transformer core 225 to receive power from the primary via the transformer. In this example, each secondary winding is center-tapped comprising two single-phase windings of opposite phase, 215a and 215b. In high current applications where the outputs are connected in parallel, the secondary windings 215 (215a, 215b) may have an equal number of turns to provide a uniform turns ratio in each of the output cells 250. A synchronous rectifier switch is provided for each phase of the secondary winding in each cell, e.g. SR1 and SR2 selectively couple their respective winding 215b, 215a to complete the circuit providing full wave rectification. A switch controller (not shown) operates the primary switches S1 210 and S2 211 in the input circuit and the secondary switches SR1 216 and SR2 217 in each of the output cells in a series of converter operating cycles. As shown the multi-cell converter uses the SAC topology described more fully in the SAC patent. Some or all of the input circuit may be located remotely from the transformer and output cells as described in the PoP Patents. The transformer and self-contained output cells of the multi-cell power converter may be formed as shown on a multi-layer printed circuit board ("PCB") 321 and encapsulated to form a package amenable to mounting directly to the semiconductor load as described in the GB Disclosure. Although the schematic diagram of FIG. 2 shows a single magnetically permeable transformer core 225 to which all windings are coupled, in the implementations shown in FIG. 3, the core 225 may be divided into a plurality of core-sets, e.g. eight U-cores in the example of FIG. 3. Each of the core sets may be coupled to the primary winding and respective turns of respective secondary windings as described more fully below.

Figure 3:
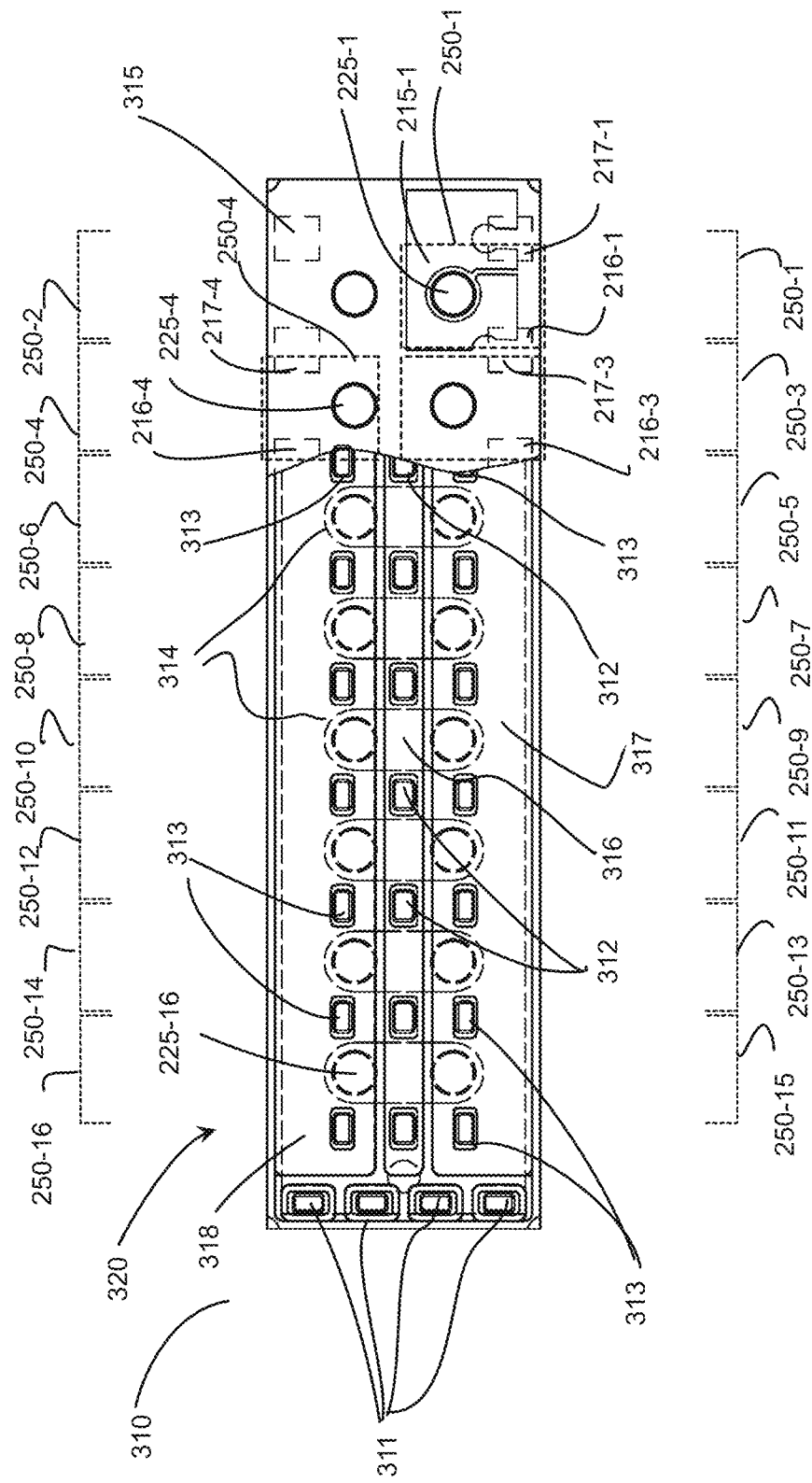
FIG. 3 shows a multi-cell converter module package.

Referring to FIG. 3 (which is a reproduction of FIG. 3 from the GB Disclosure), an example of a multi-cell converter 310 is shown having a generally rectangular encapsulated package, a large surface 320 of which may include a plurality of electrical terminations 312, 313. As shown, eight magnetically permeable core sets are interleaved with sets of output terminals 312, 313. The self-contained output cells are formed on a multi-layer printed circuit board ("PCB") and connected in parallel to supply the high currents required by electronic loads. The multi-cell converter example shown in FIG. 3 includes sixteen output cells, e.g. cells 250-1, 250-2, 250-3, 250-4 . . . 250-16, in two horizontal rows and eight vertical columns in the orientation illustrated by the brackets shown in broken lines. A portion of the right side of the module 310 is shown cutaway to reveal portions of the self-contained output cell structure. Referring to output cell 250-1, a single turn winding 215-1 is shown surrounding a core leg 225-1. Although only a single turn 215-1 is shown in FIG. 3 for cell 250-1, each output cell 250 includes a center-tapped winding (windings 215 as shown in FIG. 2) comprising two single turns of opposite phases (215a and 215b: FIG. 2) which reside in different conductive layers of the PCB and are both coupled to the same single core leg, e.g. core leg 225-1.

Figure 12:
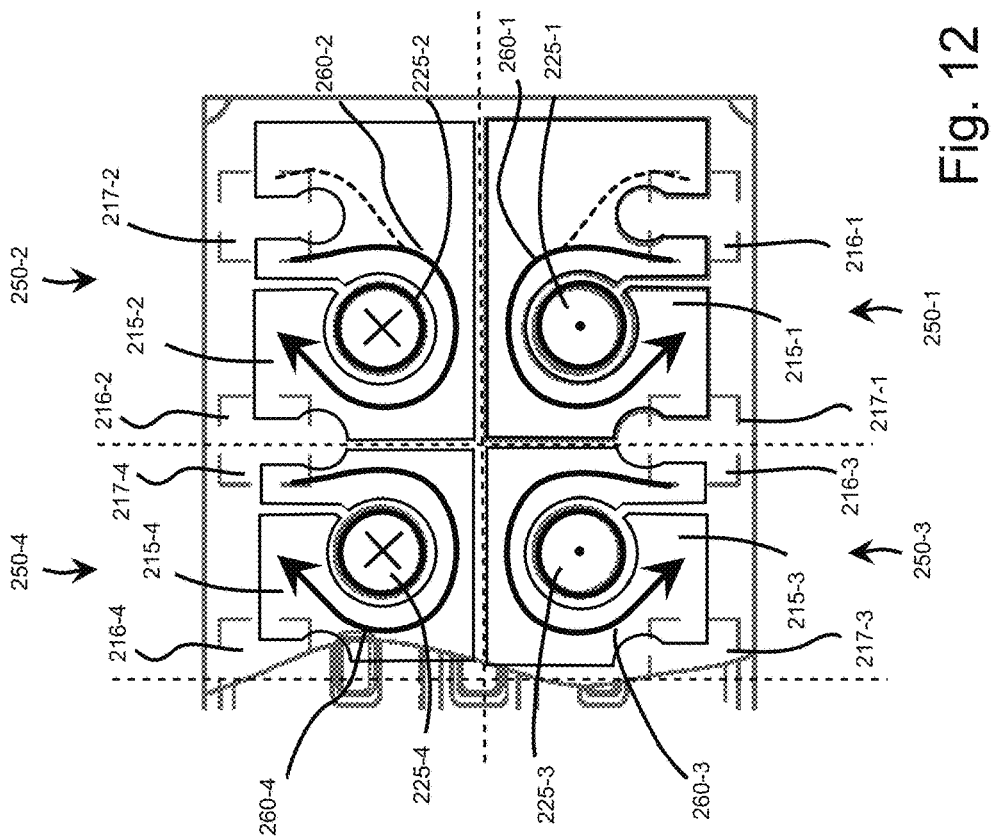
FIG. 12 shows an enlarged view of the secondary windings of FIG. 3.

FIG. 12 shows examples of turns of the secondary windings of cells 250-1, 250-2, 250-3 and 250-4 of the converter 310 of FIG. 3 formed in one of the conductive layers of the PCB. The convention used in FIG. 12 and throughout the figures herein for illustrating magnetic flux direction includes a point or dot (e.g. dot 131, FIGS. 4, 5), representing the point of an arrow, for flux coming through a core leg out of the page; an X (e.g. X 132, FIGS. 4, 5), representing the tail end of an arrow, for flux going through a core leg into the page; and curved arrows, (e.g. arrow 130, FIGS. 4, 5) to represent the flux flowing between the core legs in the magnetically permeable core plates (e.g. core plate 124, FIG. 4). As shown in FIG. 12, the magnetic flux in the top legs 225-2, 225-4 (X) for the even numbered self-contained cells 250-2, 250-4, . . . 250-16, is opposite to the magnetic flux in the bottom legs 225-1, 225-3 (dots) for the odd numbered self-contained cells 250-1, 250-3, . . . 250-15. As shown, the currents 260-2, 260-4 in the secondary windings 215-2, 215-4 of top cells 250-2, 250-4 flow clockwise and currents 260-1, 260-3 in the secondary windings 215-1, 215-3 of bottom cells 250-1, 250-3 flow counterclockwise.

The self-contained cell and winding configuration described above facilitates placement of the synchronous rectifier for each winding phase (215a, 215b: FIG. 2) at opposite edges of the output cell, e.g. 217-1, 216-1 in FIG. 3, respectively. As shown, the footprint of semiconductor dice, e.g. die 315, lie on the border of the output cells 250, and referring to output cell 250-1 for example, overlap portions of the respective secondary windings, e.g. winding 215-1. In the layout of FIG. 3, each semiconductor die includes two devices, which may for example be MOSFET switches, used to implement the synchronous rectifiers (SR1 216 and SR2 217: FIG. 2).

The above-described technology generally, and the multi self-contained output-cell converters more specifically, have greatly advanced the state of the art in delivering high currents in small spaces to semiconductor loads; however, certain performance metrics, such as the specific output resistance (described below), have thus far been limited by transformer winding resistance. The main reason for the limitation is the large number of "squares" required, e.g. greater than six, to complete each transformer turn as explained further below.

I. Distributed-Output Converter

An improved converter structure having a distributed-output circuit also based upon the SAC topology (described in the SAC Patents) will be described in connection with FIGS. 4-11, and 14-16. The distributed-output circuit includes a plurality of interdependent output-cell elements, which may be physically arranged in a step-and-repeat pattern, forming a distributed cell structure in which the winding elements and cell elements are electrically interconnected in one or more major circular strings and optionally one or more sub-strings which may be nested within the major circular string(s). In other words, the cell elements may be multiply-connected as described in more detail below. In FIGS. 4-11, 14-15, dashed lines illustrate imaginary cell element boundaries. It should be noted that the term cell element or cell in the following discussion refers to one interdependent element (part of the step and repeat pattern) of the distributed output structure in just one of the phases, which as will become more evident in the following description is operationally interdependent on the other elements in the string. The step and repeat pattern may include two cell elements coupled to a common magnetically permeable core, such as the E-cores shown. The multi-output cell structure shown in FIGS. 2 and 3 and described above, in contrast includes a plurality of self-contained "independent cells" each of which includes the components and windings necessary for operation in both phases as a stand-alone output cell, e.g. as shown in the schematic diagram of FIG. 2. The step and repeat pattern of the self-contained cells may include two self-contained cells coupled to a common magnetic core, such as the U-cores shown in the example.

Figure 4:
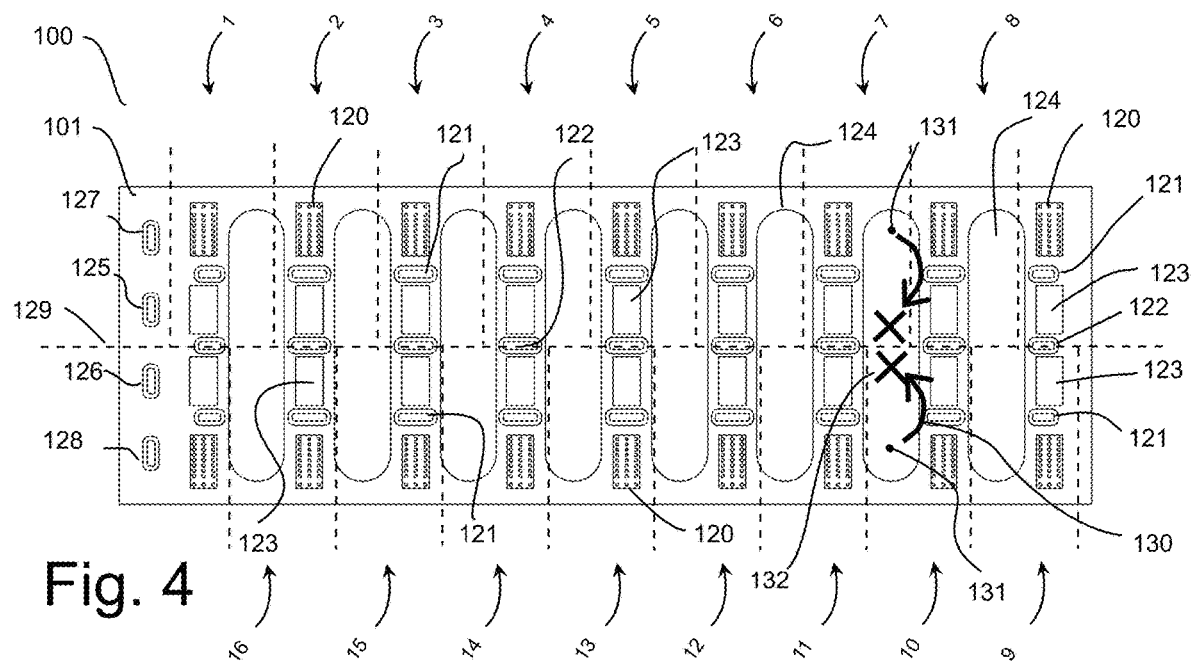
FIG. 4 shows a plan view of an improved distributed output converter.

Referring to FIG. 4 which shows the component layout of the improved distributed-output converter structure 100 having a plurality of (eight in this example) E-cores 124 arranged between nine sets of conductive terminals 121, 122 to form sixteen interdependent output cell elements, 1, 2, 3, . . . 15, 16 on a multilayer PCB 101. Note that only an exemplary one or more of the components and magnetic core structures are labeled in FIGS. 4-11, 14-16 to maintain legibility; however, it should be understood that like components carry like reference designations subject to the cell element suffices described below. The multi-layer PCB 101 may include a plurality of conductive layers in which the transformer winding elements and electrical interconnections may be formed. For example, a PCB layer stack-up may include a set of one or more conductive layers in which one or more turns of a primary winding (P) may be formed, a first set of one or more layers in which the winding elements of the first phase secondary windings (Sa) may be formed, and a second set of one or more layers in which the winding elements of the second phase secondary windings (Sb) may be formed. In this example, the winding elements of the primary winding may be connected in series to divide the input voltage and the winding elements of each phase of the secondary windings may be connected in parallel to multiply the output current and reduce output resistance. Additional conductive layers may be provided for mounting components, e.g. electronic switches (120 FIG. 4) and capacitors (123 FIG. 4), to the PCB 101. The control circuitry described in the SAC Patents and PoP Patents (not shown in the Figs.) and in Vinciarelli, Digital Control of Resonant Power Converters, U.S. Pat. No. 9,166,481 issued Oct. 20, 2015, assigned to VLT, Inc. and incorporated here in its entirety by reference (the "Digital Control" patent) can be used to control the electronic switches; the control circuitry may be remotely located, e.g. as described in the PoP Patents or included in the converter package, e.g. at one side of the converter package. Preferably, the components are located on the top (shown) and bottom (not shown) PCB surfaces for improved electrical and thermal performance, e.g. as described in Vinciarelli et al., Encapsulated Modular Power Converter with Symmetrical Heat Distribution, U.S. Pat. No. 9,516,761 issued Dec. 6, 2016, assigned to VLT, Inc. of Andover, Mass., and incorporated by reference in its entirety here (the "Symmetrical Patent").

In FIG. 4, dashed lines illustrate imaginary boundaries between each cell element in the distributed output structure, each cell element shown including a dual MOSFET 120, output capacitor 123, negative output terminal 121, one half of an E-core structure 124 and one half of a positive output terminal 122 which are shared with the neighboring cell above or below as the case may be. For example, each cell element is shown including a loop or path in the magnetically permeable core comprising half of the middle core leg (134 FIGS. 5-11) and a respective upper or lower core leg (133 FIGS. 5-11) located within the boundaries. The E-core structure includes two magnetic loops, an upper loop connecting the top leg and center leg and a lower loop connecting the bottom leg and center leg. The center leg, which may have a larger cross section than that of the top and bottom legs as shown, is therefore shared by the top and bottom loops and the top and bottom cell elements. In each of the upper right and lower left corners in FIG. 4, lying outside of the numbered cell element boundaries, components including a dual MOSFET 120, output capacitor 123, negative output terminal 121, and half a positive output terminal 122 are shown. The term "-x designated" may be used herein to refer to components that are located outside of the numbered cell boundaries, to differentiate from the components included within the numbered cells. The "-x" in a reference designation for a component indicates that it is not used in the phase being illustrated.

Like the converter shown in FIG. 3, the converter 100 of FIG. 4 may include power output terminations, e.g. positive terminations 122, and common terminations 121, distributed on the generally planar top surface of the encapsulated converter for vertical power delivery. As shown in FIG. 4, nine positive terminations 122 and eighteen common terminations 121 provide a total of twenty-seven power connections distributed in an array of nine columns and three rows. As shown in FIG. 4, the magnetically permeable core pieces 124 are disposed between each columnar set of power terminations. Beneath each core piece 124 are core legs 133 and 134 (FIG. 5), arranged to form upper and lower magnetic paths which share the middle E-core legs. The core legs extend through the PCB and are surrounded by the respective electrical windings as described in more detail below.

Although not shown in FIG. 4, all of the terminations in a row may be connected together by a conductive metal layer on the surface of the encapsulant as shown and described in the GB Disclosure (see metal strips 316, 317, and 318 connecting the terminations in their respective row in FIG. 3). Similarly, at the left-most side of the converter 100, an additional column of electrical terminations, e.g. electrical terminations 125, 126, 127, and 128, may be provided for control and power input connections to the converter. For example, terminations 125 and 126 may be used as power input terminations, e.g. to provide connections to the primary winding (137 in FIG. 5); and terminations 127 and 128 may be used as control terminations, e.g. to provide connections to the control terminals of the synchronous rectifiers (SR1 216 and SR2 217 in FIG. 2), which may e.g. be the gates of MOSFETs used to implement the synchronous rectifiers, where the switch controller is located separately from the encapsulated module.

Figure 5:
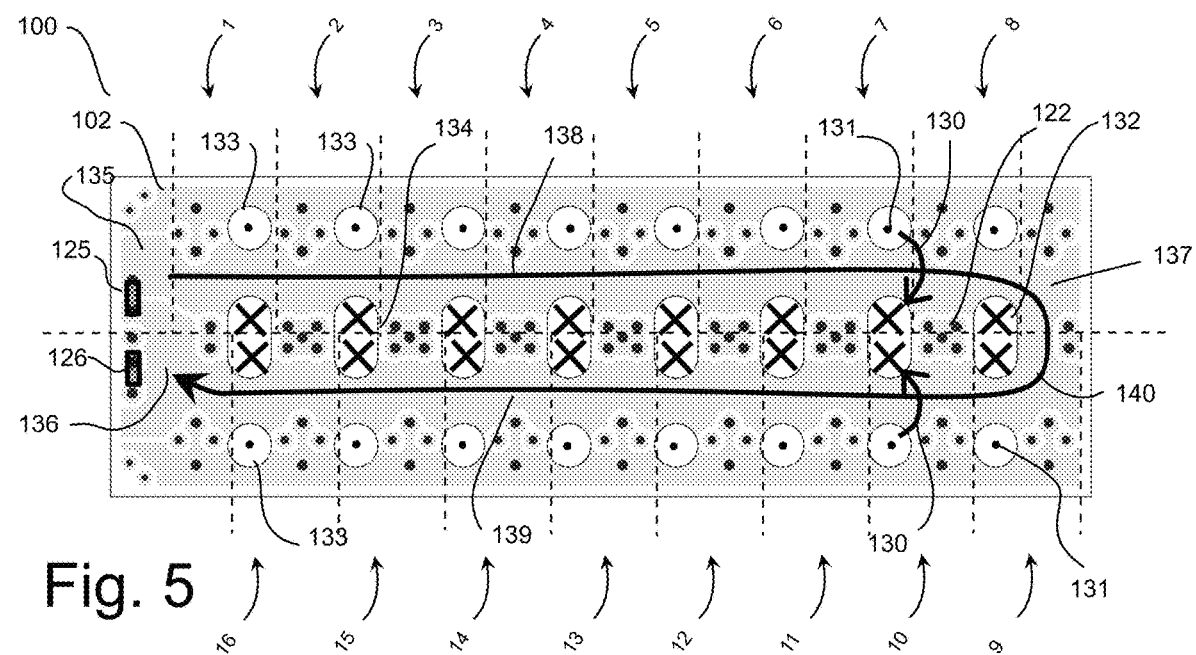
FIG. 5 shows a plan view of a conductive layer with a primary winding.

Referring to FIG. 5, a single turn 137 of a primary winding (214 FIG. 2) is shown formed in conductive layer 102 of the PCB. As mentioned above, the primary winding may comprise one or more turns, which may be formed in one or more conductive layers of the PCB. For example, a 48V input converter may use a primary winding having four turns formed in respective conductive layers, e.g. 1 turn in each layer such as shown in FIG. 5 or two or more turns formed in a single layer (not shown) depending on the application. For illustration purposes, assume the single turn primary winding 137 as shown in FIG. 5 is connected with one end to input termination 125 and the other end to termination 126. [Note that the connections between the terminals 125 and 126 and the primary winding 137 are not intended to be accurately depicted in FIG. 5. In practice several primary turns, e.g. like the one shown in FIG. 5, may be connected in series to form a multi-turn primary winding. FIG. 5 shows the conductive turn 137 extending in a first direction through a first "tunnel" of magnetically permeable paths, e.g. the upper loops formed between the top and center legs of the E-core in the upper cell elements, e.g. 1-8, and returns in the opposite direction through a second tunnel of magnetically permeable paths formed between the bottom and center legs of the E-core in the lower cell elements, e.g. 9-16. For example, a portion 138 of the primary winding 137 extends through the first tunnel, and a portion 139 of the primary winding 137 extends through the second tunnel. Arrow 140 illustrates the primary current flow in the primary turn 137 during a first phase, e.g. phase A, of operation, e.g. when the voltage at terminal 125 is greater than the voltage at terminal 126. During phase A, the magnetic flux will be going down through the center legs 134 and up through the top and bottom legs 133 as illustrated by the arrow heads (dot) and tails (X). Two arrows 130 are also shown in FIG. 5 to illustrate the magnetic flux direction between the legs.

A. One-Step Winding Elements

Figure 6:
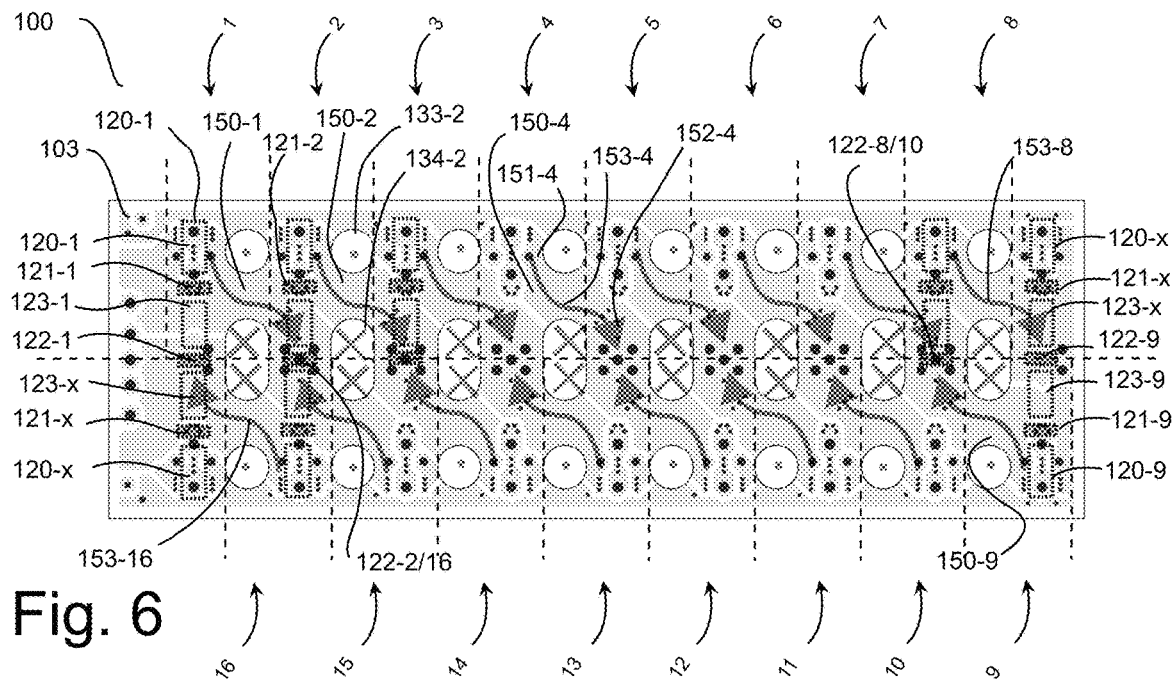
FIG. 6 shows a plan view of a conductive layer with first phase one-step secondary winding elements.

A first set of secondary winding elements 150 for the interdependent cell elements of the first phase, e.g. phase A, of the distributed output structure is shown in FIG. 6 being formed in conductive layer 103 of the PCB. Referring to FIG. 6, the phase-A secondary currents 153 in each cell, are shown flowing from the respective beginning 151 to the end 152 of the respective winding 150. (The numbering convention used throughout the figures appends the cell number to the feature reference designation, e.g. as shown in FIG. 6, secondary winding element 150-1 belongs to cell element 1, secondary winding element 150-4 belongs to cell element 4, etc.) (Note that only an exemplary one or more of the component outlines are shown in FIGS. 5-11, e.g. for cell elements 1, 2, 7, 8, 16 and between cell elements 1 and 16 and between cell elements 8 and 9 in FIGS. 6 and 7 to maintain clarity; however, it should be understood that the same components are located in each cell consistent with FIG. 4.) Note that the phase-A secondary currents in each winding or cell element flow in the same direction as in the adjacent winding or cell elements. For example, the secondary currents 153 in FIG. 6 flow from upper-left to lower-right in each of the top cell elements 1-8 and from lower-right to upper-left in each of the bottom cell elements 9-16. Although the currents in the bottom cell elements appear to flow in opposite directions, they have the same polarity as the currents flowing from the top cell elements as described in more detail below. All secondary winding elements in conductive layer 103 are operating on the same phase, e.g. phase A as defined above. Furthermore, in the distributed output structure, each secondary winding element begins 151 at the electronic switch 120 within its cell element and ends 152 at the junction of the output capacitor 123 and positive output terminal 122 in a neighboring cell element, e.g. the start 151-1 of secondary winding element 150-1 is at switch 120-1 and the end 152-1 is at the junction of positive output terminal 122-2/16 (shared by cells 2 and 16) and capacitor 123-2. Note that the end 152-1 (arrow head (not labeled)) of the secondary winding element 150-1 is located outside of the boundaries of its cell element, e.g. cell element 1, and inside the boundaries of a neighboring cell element, e.g. cell element 2.

Figure 7:
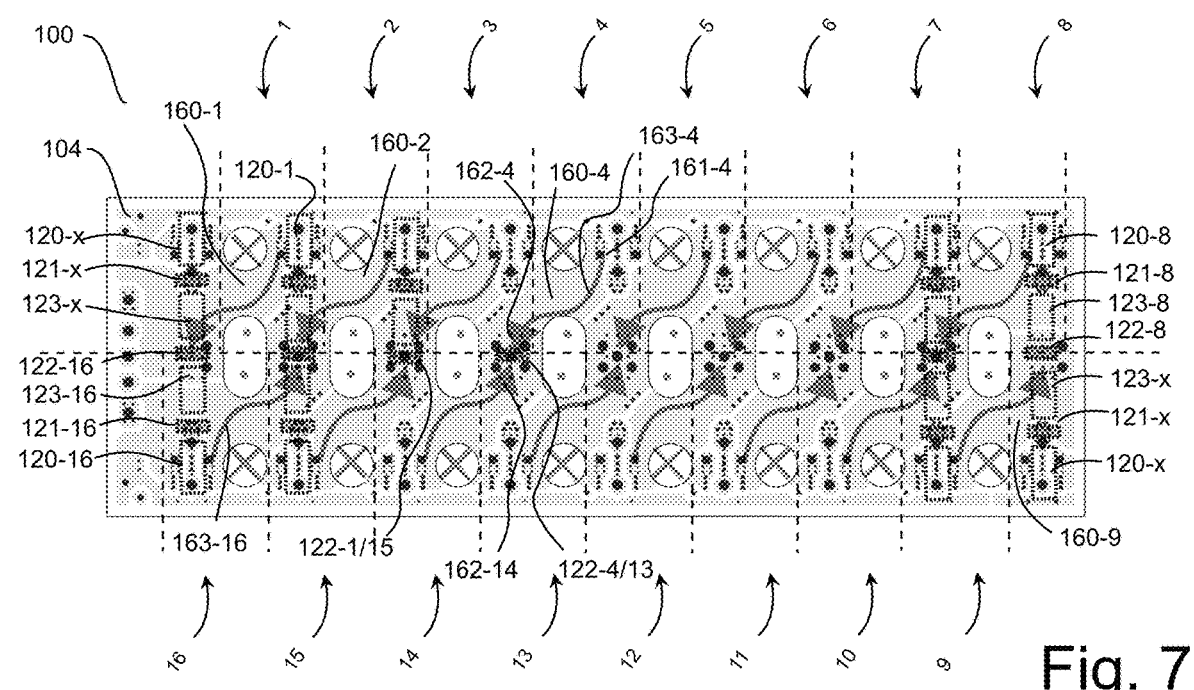
FIG. 7 shows a plan view of a conductive layer with second phase one-step secondary winding elements.

Referring to FIG. 7, a second set of complementary secondary winding elements 160 is shown formed in conductive layer 104 of the PCB. The second set of winding elements 160 are for the second phase, e.g. phase B, of the distributed output structure. The magnetic flux is therefore shown reversed for phase B, i.e. coming up out of the page (dots) through the center legs 134 and down into the page through the top and bottom legs 133 (X) in FIG. 7. The secondary currents 163 for each winding/cell element, are shown in FIG. 7 flowing from a respective beginning, 161, to a respective end, 162, of the respective phase-B winding element 160. (As discussed above, the numbering convention herein appends the cell element number to the feature number, e.g. secondary winding element 160-1 belongs to cell element 1, secondary winding element 160-4 belongs to cell element 4, and so on.) Like the phase-A example of FIG. 6, the phase-B secondary currents flow in the same direction in adjacent cell elements from upper-right to lower-left in each of the top winding/cell elements 1-8 and from lower-left to upper-right in each of the bottom winding/cell elements 9-16, which have the same polarity as the phase-B currents in the top cell elements as described in more detail below. All of the secondary winding elements in conductive layer 104 (FIG. 7) operate on the second phase, e.g. phase B, which is complementary to the first phase, phase A, defined above. Furthermore, each secondary winding element in the phase B distributed output structure starts at the electronic switch 120 within its cell element and terminates at the junction of the output capacitor 123 and positive output terminal 122 in the neighboring cell element, e.g. secondary winding element 160-4 begins, 161-4, at switch 120-4 and terminates, 162-4, at the junction of capacitor 123-3 and positive output terminal 122-3/13 (which is shared by cell elements 3 and 13). Like in the phase-A conductive layer, the switch 120 in each cell element connects the start, 161, of its respective secondary winding element, 160, to its negative output terminal 121, e.g. switch 120-1 connects the start 161-1 of secondary winding element 160-1 to negative terminal 121-1. The output capacitor 123 in each cell element is connected across its positive 122 and negative 121 output terminals, e.g. capacitor 123-1 is connected across output terminals 121-1 and 122-1.

Figure 10:
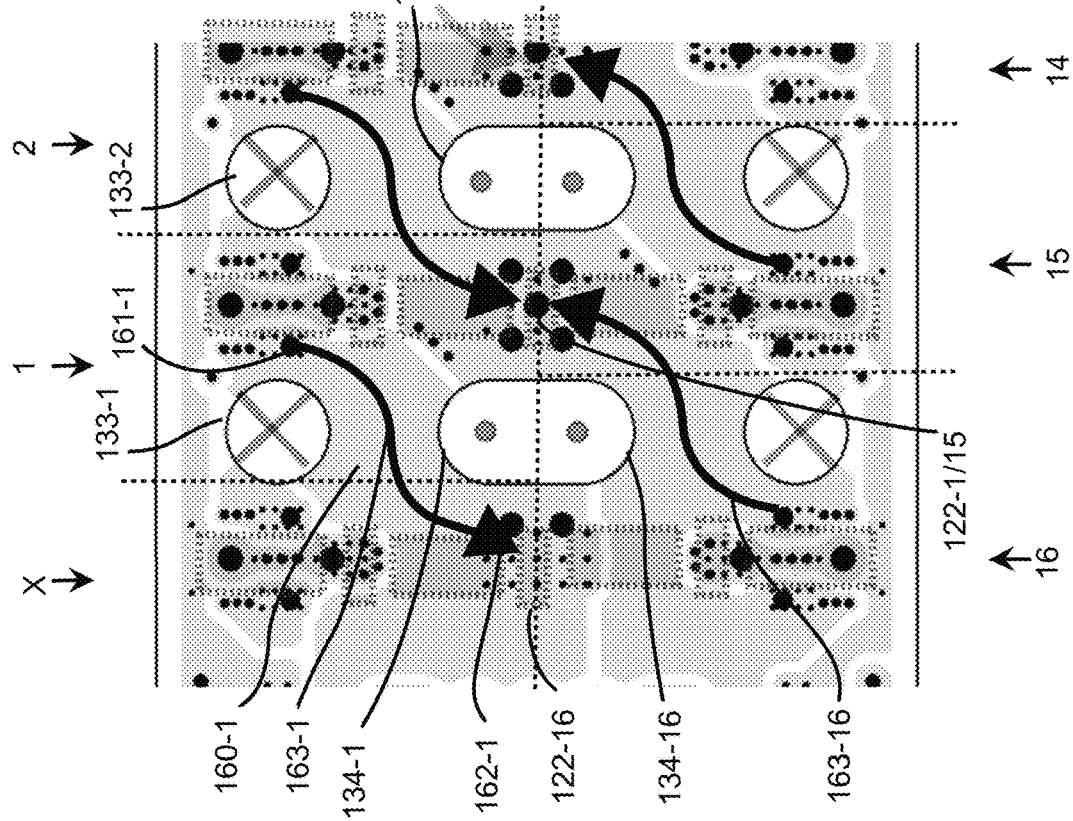
FIG. 10 shows an enlarged view of a portion of the second phase secondary winding elements of FIG. 7.

The drawing of FIG. 10 shows one end of the converter 100 magnified, including the phase B cell elements 1, 2, 15, 16 in conductive layer 104. As shown phase-B winding element 160-1 of cell element 1, passes through the "tunnel" formed by magnetically permeable path between legs 133-1 and 134-1 of cell element 1 and terminates at the junction of the positive output terminal 122-16 and capacitor 123-16 in cell element 16. It should be appreciated that the -x designated dual MOSFET 120-x located between cell elements 1 and 16 is not required for the phase-B winding elements, however, capacitor 123-x located between cells 1 and 16 contributes to filtering.

Referring to FIG. 16, a schematic diagram of the distributed-output power converter of FIGS. 4-7, 10, 11 is shown including a primary circuit, a phase-A distributed output circuit and a phase-B distributed output circuit. The primary circuit as shown includes a half bridge circuit connected to drive the primary winding 214 of transformer 225, which is part of a resonant circuit including resonant capacitor 212 and resonant inductance 213 which may preferably include the leakage inductance of the transformer. The transformer 225 includes a magnetic core structure that couples the primary winding to each of the secondary winding elements in the distributed output circuits, e.g. winding elements 150 in phase A and winding elements 160 in phase B as described above in connection with FIGS. 4-7. As shown in FIG. 16, the switches 120 in each cell element in the distributed output structures selectively connects the start 151 (phase-A) and 161 (phase B) of the respective secondary winding element 150 (phase A) 160 (phase B) to the respective negative output terminal 121, e.g. in phase A switch 120-1 connects the start 151-1 of secondary winding element 150-1 to negative terminal 121-1 and in phase B switch 120-1 connects the start 161-1 of secondary winding element 160-1 to negative terminal 121-1. Similarly, the output capacitor 123 in each cell element is connected across its positive 122 and negative 121 output terminals, e.g. capacitor 123-1 is connected across output terminals 121-1 and 122-1.

Referring to FIG. 16, the cell elements in each of the phase-A and phase-B distributed output structures are connected in a circular arrangement visible in each of the phases: in phase A (FIGS. 6, 16), the current flows between cell elements in ascending numerical order, from cell element 1 to cell element 2 in the sequence 1-2-3-4-5-6-7-8-9-10-11-12-13-14-15-16 and back to cell element 1 to complete the circle; in phase B (FIGS. 7, 16), the current flows between cell elements in the opposite direction, i.e. in descending numerical order, from cell element 16 to cell element 15 in the sequence 16-15-14-13-12-11-10-9-8-7-6-5-4-3-2-1 and then back to 16 to complete the circle. To illustrate the point further, in FIGS. 6 and 16, winding element 150-16 of cell element 16 terminates at the junction of positive terminal 122-1 and capacitor 123-1 of cell element 1, winding 150-1 of cell element 1 terminates at the junction of positive terminal 122-2 and capacitor 123-2 of cell element 2, . . . winding 150-8 of cell element 8 terminates at the junction of positive terminal 122-9 and capacitor 123-9 of cell element 9, . . . and so on back to cell 16. The phase-B cell elements (FIGS. 7 and 16) are similarly connected but in the reverse direction: winding 160-1 of cell element 1 terminates at the junction of positive terminal 122-16 and capacitor 123-16 of cell element 16, winding element 160-16 of cell 16 terminates at the junction of positive terminal 122-15 and capacitor 123-15 of cell element 15, . . . winding element 160-9 of cell element 9 terminates at the junction of positive terminal 122-8 and capacitor 123-8 of cell 8, . . . and so on back to cell element 1.

In addition to the major circular connection of cell elements described above, the cell elements in the distributed-output structure may be multiply connected to also form sub-circle connections, e.g. circular connections nested within the major circular connection. Several such sub-circle connections are visible in FIG. 16. For example, in addition to being an element in the major circular connection (which includes all of the cell elements as described above) each cell element in FIG. 16 is also a member of several sub-circles (nested within the major circular connection), including its immediate neighbors. Using the above string notation format, cell element 4 for example is a member of the two-element sub-circle connection 4-13, the four-element sub-circle connections 4-5-12-13 and 3-4-13-14; the six-element sub-circle connections 2-3-4-13-14-15, 3-4-5-12-13-14, and 4-5-6-11-12-13; the eight-element sub-circle connections 1-2-3-4-13-14-15-16, 2-3-4-5-12-13-14-15, 3-4-5-6-11-12-13-14, and 4-5-6-7-10- 11-12-13, and the ten-element sub-circle connections 1-2-3-4-5-12-13-14-15-16, 2-3-4-5-6-11-12-13-14-15, and 3-4-5-6-7-10-11-12-13-14, 4-5-6-7-8-9-10-11-12-13, and so on for the distributed-output structure of FIGS. 6, 7, 16. The step- and repeat pattern of interdependent cell elements in the distributed structure may be configured to increase or decrease the extent of the inter-cell element multiply connectedness. For example, the one-step and two-step embodiments shown in FIGS. 4-9 use a pattern that shares the positive output terminals between top and bottom rows of cell elements. In other words, the positive output terminals in the bottom row overlap those in the top row creating the sub-circular connections described above. If the positive output terminals did not overlap between rows, that would eliminate the sub-circular connections reducing the multiple connectedness.

As shown in FIGS. 6 and 7 each secondary winding element, e.g. elements 150, 160, passes through only the magnetically permeable path residing within its respective cell element, e.g. phase-A winding element 150-2 of cell element 2 passes through the magnetically permeable path between top leg 133-2 and center leg 134-2 in FIG. 6 and phase-B winding element 160-2 of cell 2 passes through the magnetically permeable path between top leg 133-2 and center leg 134-2 in FIG. 7. The core and winding structure shown in FIGS. 4-7 therefore provides a 16:1 voltage transformation ratio for each primary turn to each secondary winding element, and by way of example if used with four primary turns connected in series would yield a 64:1 voltage transformation ratio.

Unlike previous self-contained multi-cell output structures, in which each output cell may be physically demarcated by physical boundaries and in which current flow starts and ends within the cell irrespective of phase, in the distributed output structure, current flows from cell element to cell element as described above (and across neighboring cells as described in the two-step distributed structure described below) forming elemental carousels, in opposing directions depending on phase. As a result of the directional change in current flow between phase-A and phase-B in the distributed output structures, cell element boundaries for the physical layouts, e.g. as shown in FIGS. 6 and 7, drawn consistent with the electrical convention described above, shift between phases. Thus, the physical element boundaries for phase-A in FIG. 6 (which are also shown in FIGS. 4 and 5); are shifted with respect to the physical boundaries shown in FIG. 7 for phase-B to account for the change in current direction between cell elements in opposite phases. Accordingly, the physical representation of the dual MOSFET 120-1, capacitor 123-1, and terminals 121-1 and 122-1 which are within cell element 1 for phase A (FIG. 6) fall outside of cell element 1 in phase B (FIG. 7) (and are therefore labeled 120-*x*, 123-*x*, and 121-*x*) for phase B. Similar changes between phases are evident for all of the boundary condition cells, i.e. cells 1, 8, 9, and 16.

B. Two-Step Winding Elements

Figure 8:
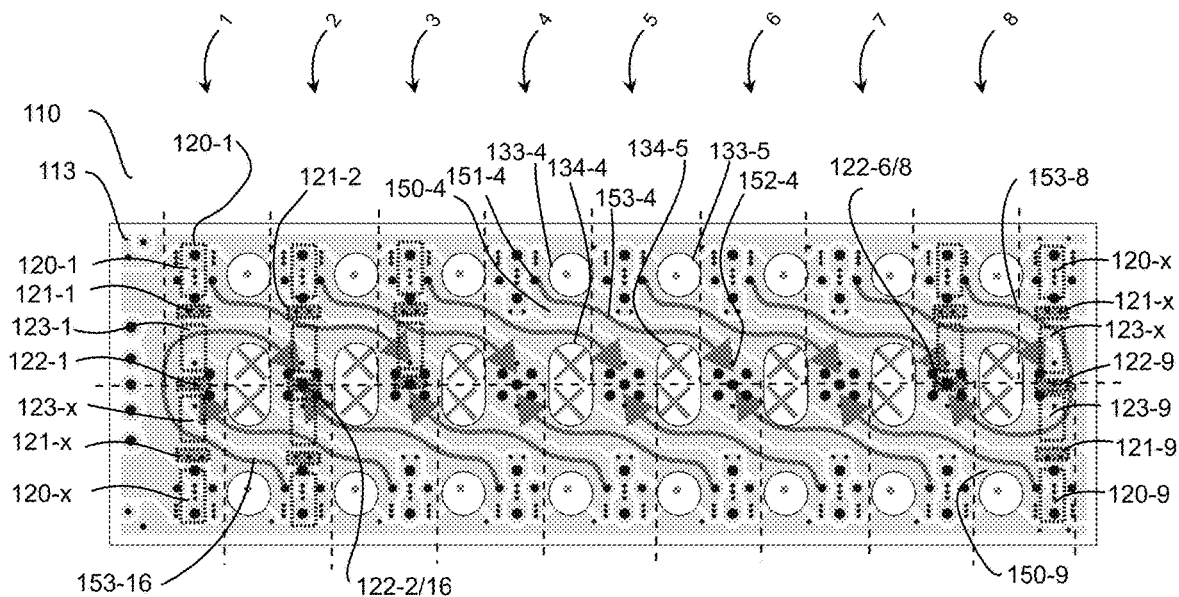
FIG. 8 shows a plan view of a conductive layer with first phase two-step secondary winding elements.
Figure 9:
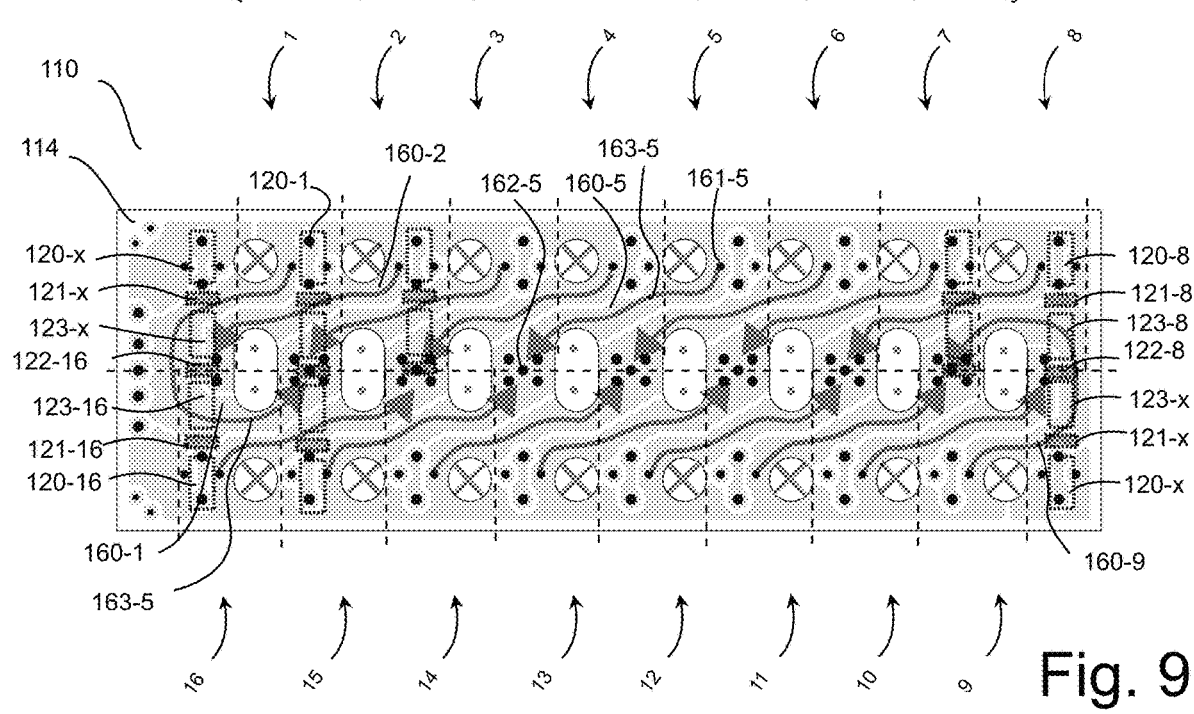
FIG. 9 shows a plan view of a conductive layer with second phase two-step secondary winding elements.

Referring to FIGS. 8, and 9, an alternate cell/winding element structure is shown using the same conventions as in the previous one-step example (FIGS. 6 and 7). (Although component outlines are shown only for some cell elements, e.g. 1, 2, 7, 8, 16 between cell elements 1 and 16 and 8 and 9 in FIGS. 8 and 9, it should be understood that the same components are located in each cell consistent with the layout shown in FIG. 4.) In FIG. 8, the first set of winding elements 150 are shown formed in conductive layer 113 of the PCB for the first phase, e.g. phase A of the two-step distributed-output structure. The phase-A secondary currents 153 in each cell, are shown flowing from the respective beginning 151 to the end 152 of the respective winding element 150. The direction of the phase-A winding elements 150 and secondary currents 153 in layer 113 flow in the same direction in adjacent cells, e.g. from upper left to lower right in the top row, cell elements 1-8, and from lower right to upper left in the bottom row, cells 9-16 with the same polarity as explained more fully below. All of the secondary winding elements 150 in conductive layer 113 (FIG. 8) are operating on the same phase, e.g. phase-A. Furthermore, each secondary winding element 150 starts at the electronic switch 120 within its respective cell element and terminates at the junction of the output capacitor 123 and positive output terminal 122 in a neighboring cell element, e.g. secondary winding element 150-4 begins 151-4 at switch 120-4 and terminates 152-4 at the junction of capacitor 123-6 and positive output terminal 122-6/12 (which is shared by cell elements 6 and 12). In this example, cell elements 5 and 6 are both considered to be neighboring cell elements of cell element 4, and cell elements 6 and 7 are both considered to be neighboring cell elements of cell element 5, and so forth. Similarly, the output capacitor 123 in each cell element is connected across its positive 122 and negative 121 output terminals, e.g. capacitor 123-1 is connected across output terminals 121-1 and 122-1.

Note that each two-step secondary winding element passes through two magnetically permeable paths, one within its cell and one in a neighboring cell, terminating two cell elements over. For example, secondary winding element 150-4 of cell element 4 passes through the magnetically permeable path between top leg 133-4 and center leg 134-4 of cell element 4 and the magnetically permeable path between top leg 133-5 and center leg 134-5 of cell element 5, terminating at the positive output terminal in cell element 6 as shown in FIG. 8.

Figure 11:
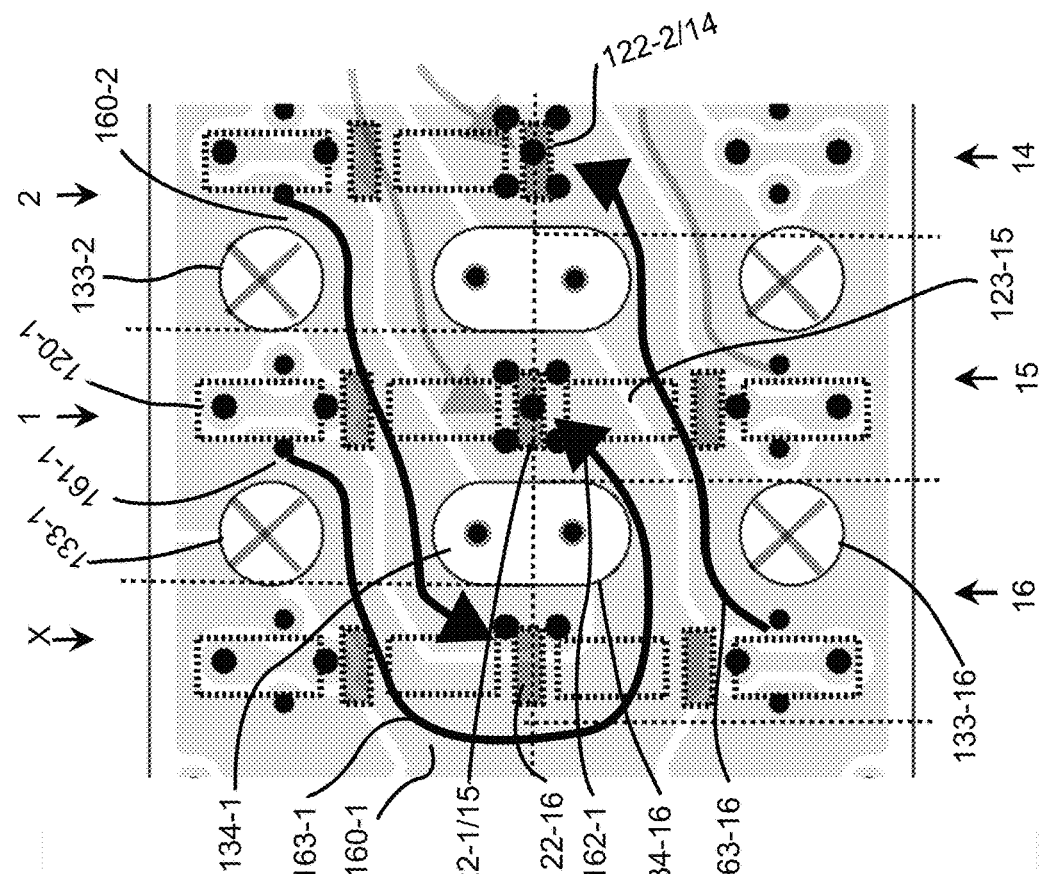
FIG. 11 shows an enlarged view of a portion of the second phase two-step secondary winding elements of FIG. 9.

In FIG. 9, the second set of secondary winding elements 160 are shown formed in conductive layer 114 of the PCB for the second opposite phase, e.g. phase B, of the two-step distributed-output structure. A magnified section of FIG. 9 including cell elements 1, 2, 16, 15 and a portion of 14, is shown in FIG. 11. The phase-B secondary currents 163 in each cell element, are shown flowing from the beginning 161 to the end 162 of the respective winding 160. Like the phase-A winding elements (FIG. 8), the direction of the phase-B secondary winding elements 160 and secondary currents 163 in layer 114 flow in the same direction in adjacent cell elements, e.g. from upper right to lower left in the top row, cell elements 1-8, and from lower left to upper right in the bottom row, cell elements 9-16, with the same polarity as the currents in the top cells as described in more detail below. Each two-step phase-B secondary winding element also passes through two magnetically permeable paths, one within its cell and one in a neighboring cell, ending (162) two cell elements over from the start (161). For example, secondary winding element 160-2 of cell element 2 passes through the magnetically permeable path between top leg 133-2 and center leg 134-2 of cell 2 and the magnetically permeable path between top leg 133-1 and center leg 134-1 of cell 1, terminating at the positive terminal to the left of cell element 1 in cell element 16 as shown in FIGS. 9 and 11.

The cell elements in the two-step distributed output structure of FIGS. 8 and 9 are interleaved creating two circular cell strings visible in each of the phases: one circular cell string includes all of the odd numbered cells 1-3-5-7-9-11-13-15-1 and the other includes all of the even numbered cells 2-4-6-8-10-12-14-16-2. The odd string is shown interlaced with the even string with cells from each being interleaved with the other. Like the one-step example shown in FIGS. 6 and 7, the strings of the two-step secondary of FIGS. 8 and 9 have no ends per se, but at the physical ends of the converter, the two-step secondary winding element at the converter boundary, i.e. the fold, must make a turn to continue in the next row of elements, e.g. the winding element 150-8 of cell element 8 makes a turn at the end of the top row, i.e. after passing through the magnetically permeable path between top and center core legs, 133-8 and 134-8, of cell element 8, to continue in the bottom row, i.e. through the magnetically permeable path between bottom leg 133-9 and center leg 134-9 of cell element 9. Similarly, the winding 150-16 of cell element 16 makes a turn at the end of the bottom row, after passing through the magnetically permeable path between core legs 133-16 and 134-16 of cell element 16 to continue in the top row, i.e. through the magnetically permeable path between legs 133-1 and 134-1 of cell element 1.

The close up of FIG. 11 includes the winding element at the end of the converter between cell element 1 and cell element 16 in the phase-B layer 114. As shown phase-B winding element 160-1 of cell element 1, changes direction after passing through the magnetically permeable path between core legs 133-1 and 134-1, i.e. makes a U-turn around the center core leg 134-1/134-16, to continue through the magnetically permeable path between legs 133-16 and 134-16 of cell 16 and then terminates at the junction of the positive output terminal 122-15 and capacitor 123-15 in cell element 15. Like in the one-step distributed structure described above and illustrated in FIGS. 6, 7, and 16, the cell elements of the two-step distributed output structure may also be multiply connected in the same manner. The multiple connections are visible in FIGS. 8 and 9, cell element 4 in FIG. 8 for example is a member of the two-element sub-circle connection 4-12, the four-element sub-circle connections 2-4-12-14, 4-6-10-12; and the six-element sub-circle connection 2-4-6-10-12-14, in addition to the large circle 2-4-6-8-10-12-14-16 described above.

As shown in FIGS. 8 and 9 and discussed above, each secondary winding element passes through two magnetically permeable paths formed by the core halves residing in its respective cell element and that of a neighboring cell element, e.g. secondary winding element 150-4 of cell element 4 passes through the magnetically permeable path between legs 133-4 and 134-4 and the magnetically permeable path between legs 133-5 and 134-5 in FIG. 8. As shown in FIG. 5, the primary winding couples all 16 loops in the core structure and each secondary winding element couples two of the loops. The winding structure shown in FIGS. 8 and 9 therefore provides an 8:1 voltage transformation ratio for each primary turn to each secondary winding element, and by way of example, if used with four primary turns connected in series would yield a 32:1 voltage transformation ratio. In other words, the two-step output structure produces twice the voltage of the one-step structure for the same primary voltage. The losses associated with a longer and narrower secondary winding reflect a tradeoff compared to the increased core losses associated with reducing the number of primary turns to achieve the same turns ratio. Stated generally, a distributed output structure having NT primary turns, each of which couples NP magnetic loops, and secondary winding elements coupling NS of the NP loops, establishes a voltage transformation ratio of NT*NP/NS.

C. Cell Symmetry & Boundary Conditions

As described above, the distributed output structures include a plurality of interdependent cell elements arranged in step and repeat patterns electrically interconnected in circular and sub-circular strings. Physically the cell elements may be arranged in rows as shown in FIGS. 6-9, 16, e.g. top row (cell elements 1-8) and bottom row (cell elements 9-16). Within each phase, the cell elements in each of the rows carry output current and all of the cell elements form a string that has been physically folded at each end to form the circular connection described above. For example, consider one fold being located between cell elements 8 and cell 9 and the other located between cell elements 16 and 1 of the one-step distributed output structure illustrated in FIGS. 6, 7, and 16. Viewed from such a perspective, it becomes clear that the top and bottom cell elements within each phase operate in concert, that the winding elements and the secondary currents carried in them all flow with the same polarity, etc.

Furthermore, one can see that the components outside the cell elements (-x designated) at the folds, e.g. between cell element 8 and cell element 9 and between cell element 16 and cell element 1, would not be required if the string of cell elements had not been physically folded, i.e. into the two rows, because there would be a neighboring cell element, e.g. cell element 9 in phase A (FIG. 6) or cell element 8 in phase B (FIG. 7) to provide those connections. Comparing the two phases of the one-step example in FIGS. 6 and 7, components 120-1 and 123-1 within cell element 1 in phase A (FIG. 6), are not used in phase B (FIG. 7) because of the change in current direction, and are therefore labeled as "-x designated" components in phase B (FIG. 7).

An unfolded string of N cell elements requires N+1 sets of components to provide for the change in current direction between phases. The extra set (+1) of components being the -x designated components at the end of the string. When the string is physically folded as shown for example in FIGS. 4-9, 16 an additional set of components may be required at each fold, thus N+2 sets of components are required for the circular connection of cell elements arranged in two rows with a fold at each end. The second extra set of components provide for the change in current direction at the additional end/boundary condition introduced by the physical folds. Stated more generally, the number of component sets required for the step and repeat pattern of N cell elements may be expressed as N+F, where N is the number of cells and F is the number of folds. As described in the Symmetry Patent, it is preferred to have the switches and capacitors on opposite PCB surfaces, which effectively doubles the number of switches and capacitors, i.e. 2(N+F) component sets for the folded string of N cell elements.

The two-step distributed output structure shares the features described above for the one-step structure. Consider the string of cell elements in the two-step converter in FIGS. 8 and 9 having been folded between cell elements 8 and 9 and between cell elements 16 and 1. Once again the folded string perspective reveals that the top and bottom cells are the same, and that the winding elements are arranged to, and the secondary currents carried in them, have the same polarity. Similarly, the -x designated components outside the cell elements at each fold, e.g. between cell elements 8 and 9 and between cell elements 16 and 1, provide for the change in direction between phases at the folds/row boundaries. In the two-step phase A distributed output structure (FIG. 8) the components 120-1 and 123-1 are included within cell element 1, but because of the directional change/boundary shift, those same components are not used in phase B and are therefore "-x designated" components as shown in FIG. 9.

The two-step winding structure imposes an additional boundary condition on the cell elements at the end of the converter, e.g. at the folds at the end of each row. As noted above, each winding element 150 or 160 that begins in a cell element located at the end of the row, e.g. cell elements 8 and 16 in phase A (FIG. 8) and cells 1 and 9 in phase B (FIG. 9), needs to change direction, i.e. make a U-turn around the respective center leg to continue in the adjacent row. Thus, the folds introduce an additional conductor length in the winding elements at the ends of the rows and thus an additional resistance in those winding elements. The boundary conditions described above may be avoided for cell elements physically arranged in a circle, however, such configurations are not easily scaled or manufactured. Thus the extra component and resistance penalties may be worthwhile tradeoffs for the increased scalability and manufacturability of a rectilinear package achievable with rectilinear arrays of cell elements as described in FIGS. 6-9.

D. Reduced Number of Squares Per Transformer Turn

One figure of merit for a winding structure is the minimum number of squares required to form the winding. The number of squares may be thought of as the length of a winding divided by a weighted average of the width of the winding over its length. Referring to FIGS. 14 and 15, the concept is illustrated for winding elements 160-16 in cell element 16 of each of the one-step and two-step examples with a plurality of arrows labeled W1 through W7 in each indicating the width, W, of the respective winding element at different points along its length, L, (represented by the current arrow 163-16). Naturally, the smaller the minimum number of squares required, the lower the winding resistance for any given conductor thickness. It follows then the number of squares required for a winding may directly impact converter efficiency.

Figure 13:
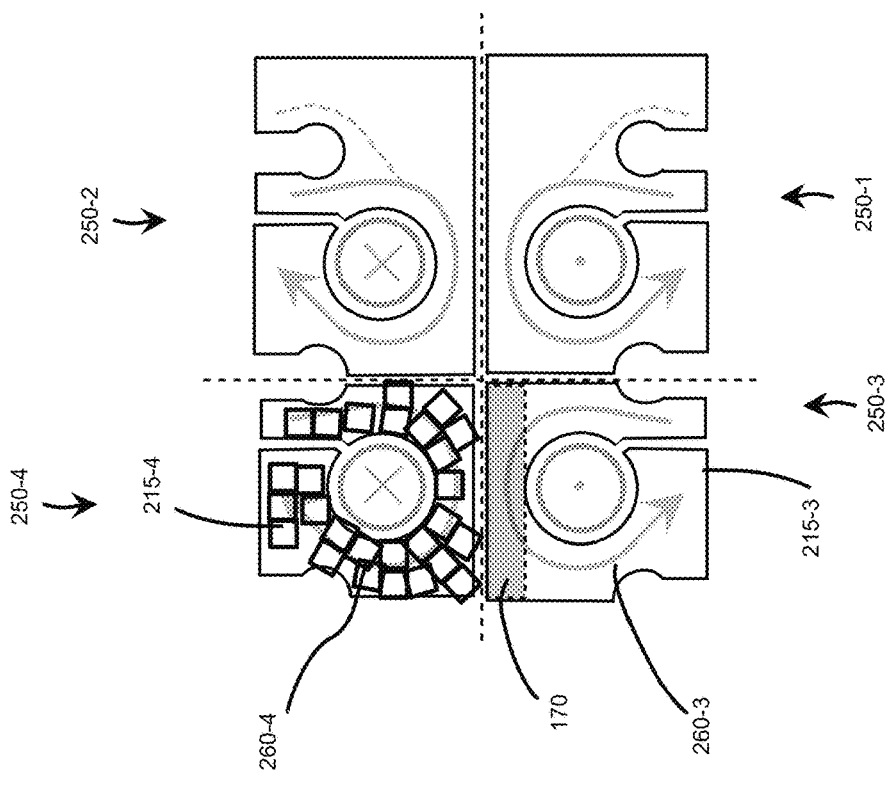
FIG. 13 shows dimensional qualities of the secondary winding of FIG. 12.

The squares concept is illustrated in FIGS. 13, 14, and 15, each of which show a plurality of squares placed (as an approximation) on the respective winding or winding elements. FIG. 13 shows for the converter of FIGS. 3 and 12, winding 260-4 having a length approximately 16 squares long, approximately 27 squares summed over of that length, yielding a weighted average width of 1.7 squares, which results in a minimum of at least 9.5 squares to form the winding. As can be seen the cell and winding structure of FIGS. 3 and 12 is inherently limited by the minimum number of squares needed to form each turn of the secondary winding, e.g. turns 215-3, 215-4 (FIG. 12). The circular turn has a length, L, (e.g. current arrows 260 FIG. 12) that is $2\pi$ times its radius, R. (The radius of the circular turn may approach, but not reach, one half of the average width, W, of the turn for relatively small diameter core legs.) However, in practice, the length, L, of the circular turn will be more than $2\pi$ or over 6 times its width, W. i.e. requiring a minimum number of more than 6 squares to form the circular winding. Increasing the width of the turn increases the radius and thus does not avoid the theoretical limit.

The one-step cell and winding structure shown in FIGS. 6 and 7 reduces the number of squares required to form each winding element of the secondary windings, e.g. winding elements 150 (FIG. 6) and 160 (FIG. 7), reducing winding resistance and improving converter efficiency. The reduction in squares is illustrated in FIG. 14 which shows the winding element 160-2 of cell element 2 (FIGS. 7, 10) having a plurality of squares placed (as an approximation) on the winding element. As can be seen clearly in FIG. 14, the length of the winding element 160-2 is approximately 13 squares and the number of the squares summed over that length is approximately 63, yielding a weighted average width of 4.8 squares. Thus the one-step winding elements 150, 160 of FIGS. 6, 7, and 14, require 13/4.8 or approximately 3 squares of conductor which is a significant improvement over the circular turn of the self-contained windings in FIGS. 3, 12, and 13. Computer simulation results show improvements comparable to those revealed by the rough graphical approximation of FIG. 14, e.g. the number of squares required for the one-step secondary may be 3 squares, or less than 6 squares per winding element.

The two-step cell and winding structure shown in FIGS. 8 and 9 also provides a reduction in the minimum number of squares required, which may not be as readily apparent as in the one-step structure. FIG. 15 shows the two-step winding element 160-2 of cell 2 (FIGS. 9, 11) having a plurality of squares placed (as an approximation) on the winding element. As can be seen, the length of the two-step winding element 160-2 (FIG. 15) is approximately 22 squares long and the number of the squares summed over that length is approximately 58, yielding a weighted average width of 2.6 squares. Thus, the two-step winding elements 150, 160 of FIGS. 8, 9, and 15, require 22/2.6 or approximately 8 squares of conductor. Recall that the two-step structure produces twice the output voltage (and thus one half the current) of the one-step structure (i.e. it should be compared with two "transformer turns"). As used herein, the number of transformer turns of a winding element is measured by the number of magnetic paths to which the winding element couples, e.g. the one-step winding elements each couple a single magnetic pathway and are considered a single transformer turn and the two-step winding elements each couple two magnetic pathways and are thus considered two transformer turns and the transformer turn length is the total length of the winding element divided by the number of transformer turns, i.e. the number of magnetic paths it couples. The number of squares of per transformer turn of the two-step winding elements is, therefore, 8 squares total divided by 2 turns which yields approximately 4 squares per "transformer turn," which is also a significant improvement over the circular turn of the self-contained windings in FIGS. 3, 12, and 13.

As illustrated in FIGS. 14 and 15 by the current arrows representative of the length of the winding, each of the winding elements has a length measured from a first end connected to the switch on one side of the output cell to a second end connected to an output terminal on the opposite side of the output cell, which may be in an adjacent cell or a more distant neighboring cell, e.g. in the case of a multi-step, e.g. two-step winding element. As described above, each of the one-step winding elements has a "transformer turn length" that is less than six, or more preferably less than three, times the weighted average transformer turn width between ends; and each of the two-step winding elements has a "transformer turn length" that is less than six, or more preferably less than four times the weighted average transformer turn width between ends.

E. Primary Overlap

Another limitation of the self-contained cell and winding structure arises from the fact that only a small proportion (that which runs between the top and bottom core legs as shown for winding 260-3 in FIG. 13) of each secondary turn directly overlaps the primary winding (which runs through the core legs and around the outsides of the core legs). The cell and winding structure shown in FIGS. 6 and 7 improves coupling between primary and secondary windings over the old winding structure. Referring to FIG. 14, the shaded area 170 illustrates the amount of overlap between secondary winding element 160-1 with the primary winding. As seen in FIG. 14 most, e.g. at least 50% and more preferably 66%, of the length of the secondary winding element overlays the primary winding. For comparison, FIG. 13 shows the relative length of secondary winding overlap for winding 260-3. As can be seen, there is significant improvement in the one-step winding element in FIG. 14. FIG. 15 shows the two-step winding element 160-1 having two shaded areas 170A, 170B indicating the overlap with the primary winding. The winding element 160-1 shown in FIG. 15 illustrates the boundary case in which the winding element makes a U-turn (described above), is the longest of the two-step winding elements, and therefore represents the worst case overlap for the two-step winding elements. Together the shaded areas indicate that at least half of the length of winding element 160-1 overlaps the primary winding. The turns of the standard two-step cell elements increase the overlap to at least 80% of the length of the winding element, e.g. winding element 160-2. The improved cell elements of FIGS. 4-12, 14 and 15 therefore offer a significant improvement in the percent overlap of the secondary winding elements with the primary winding.

F. Leg Cross Section

Referring to FIG. 12, it is clear that the secondary turns of the independent cell structure almost completely encircle their respective core legs. For example, the metal forming turn 215-4 as shown (FIG. 12) appears to surround nearly 360 degrees of the cross-section of the core leg 225-4 in that layer. Even allowing for a distribution of conductive vias connecting one end of the turn to its respective switch and the other end of the turn to its respective output terminal, the turn surrounds at least 300 degrees of the leg cross-section. By comparison, the winding elements of the distributed output structure encircle much less of their respective core legs. Referring to FIG. 17, a magnified view of one-step phase B winding element 160-2 is shown relative to its respective outer 133-2 and middle 134-2 core legs. As shown dashed lines have been drawn from the center of each leg and extending to the winding element to illustrate the extent to which winding element 160-2 surrounds each of its respective core legs. The angle 183-2 formed by the lines from leg 133-2 is approximately 180 degrees. If measured between the connecting vias at each end of the winding element, even less of the circumference of each core leg in the conductive layer is surrounded, i.e. less than 180 degrees of either leg.

The two-step winding elements surround even less of the circumference of their respective core legs. Referring to FIG. 18, an enlarged view of winding element 160-2 of the two-step phase B winding element is shown with dashed lines from the centers of its respective core legs to illustrate the portion of each leg surrounded by the winding element. Angles 183-2A, 184-2A are the angles for the core legs 133-2 and 134-2 respectively in cell element 2 and angles 183-2B, 184-2B are the angles for the core legs 133-1 and 134-1 respectively in neighboring cell element 1. As shown, winding element 160-2 surrounds 180 degrees or less of each of the core legs. Note that as shown in FIGS. 11 and 18, metal in conductive layer 114 connects the starting end of the winding elements in each of the top and bottom rows of cell elements, however, this portion of the conductive layer does not form part of the winding elements which properly begin at their respective switches and end at their respective positive output terminals. Because of the boundary conditions described above for the folds, the two-step winding elements in cell elements at the end of each row must make a turn to continue in the adjacent row, which causes the respective winding elements in those end cell elements to surround more, about 270 degrees, of the center leg of the end cell element. For example, winding element 160-1 of cell 1 in FIG. 18, makes the U-turn described above and as a result surrounds about 270 degrees of center core leg 134-1/16. In summary, the winding elements of the distributed output structures described in connection with FIGS. 5-8 advantageously encircle or surround less than half of their respective core legs, except for the boundary cases of the end cell elements in the two-step structure.

As described above, the secondary winding elements of neighboring cells step across respective subsets of the magnetically permeable paths in the core structure, e.g. one-step winding elements (FIGS. 6 and 7) step across one magnetically permeable path within its respective cell in the same direction as the other windings in the same conductive layer. Similarly, the two-step winding elements step across two magnetically permeable paths, that of its respective cell and that of its neighboring cell, in the same direction as the other windings in the same layer. The direction being referenced is from one cell to the next, so in the phase-A cells, the winding elements step in the direction of ascending cell number, e.g. 1 to 2 to 3, etc. for the single-step winding elements, and 1 to 3 to 5, etc. for the two-step winding elements. For the phase-B winding elements, the winding elements step in the direction of descending cell number, e.g. 16 to 15 to 14, etc. for the single-step winding elements, and 16 to 14 to 12, etc. for the two-step winding elements.

It will be appreciated from the layouts of FIG. 3 and FIG. 4, that there exists a natural output termination pitch that results from the independent or distributed output structures of the converters. For example, the lateral (or longitudinal) spacing between output termination columns is a function of the cell element geometry. Similarly, the vertical (or latitudinal) spacing between output termination rows is a function of, among other things, the cell element geometry. The improved cell and secondary winding elements of the distributed output structures described above may be used to decrease the cell pitch and increase the cell density over the independent cell and winding structure of FIGS. 3, 12, and 13. While several metrics, such as power density and current density, may be used to compare the relative merits or performance of various power converters, they are a function of heat removal systems.

One measure of converter performance that avoids dependency on heat removal systems is the "specific output resistance" defined herein as the product of the output resistance, Rout, of the converter and the volume, V, of the converter, e.g. =Rout*V. As an alternative to the volumetric calculation, the specific output resistance may be expressed in terms of the area, A, e.g. of the footprint of the converter on a mounting surface such as a motherboard: Rout*A. The specific output resistance may be calculated for the converter as a whole or an individual cell element, e.g. using cell element output resistance and cell element volume or footprint area.

State of the art power converters delivering less than 1V exhibit a specific output resistance greater than 100 mΩ mm$^2$ (based upon area) or 300 mΩ mm$^3$ (based upon volume).

For example, an independent-cell fixed-ratio converter based on the SAC topology, e.g. as shown in FIGS. 2 and 3, operating at approximately 2 MHz for delivering 1V or less, may have cell dimensions of approximately 4.3×3.5 mm, cell output resistance of approximately 7.2 mΩ, which in a 24 cell (12 column) converter provides an output resistance of approximately 0.3 mΩ, occupies a converter footprint of 46 mm×8.6 mm, and a converter height of 2.7 mm, yielding a converter area of 395.6 mm$^2$ and converter volume of 1068 mm$^3$. The specific output resistance of such a converter based on area is 118 mΩ mm$^2$ and based on volume is 320 mΩ mm$^3$. Note that the converter footprint is 4 mm longer than 12 cells in each row to allow for input connections and end of row setbacks.

By comparison a comparable converter using the improved distributed output interdependent cell and winding structure of FIGS. 4-11, 14, and 15 may benefit from a reduced cell footprint, e.g. 3.75 mm×2.5 mm cell element dimensions. The one-step cell output resistance is approximately 5.0 mΩ, which in a 24 cell (12 column) converter provides an output resistance of approximately 0.21 mΩ, occupying a converter footprint of 33×8 mm, having a converter height of 2.7 mm, a converter area of 264 mm$^2$ and a converter volume of 713 mm$^3$. The specific output resistance of a converter using such one-step cells based on area is 55 mΩ mm$^2$ and based on volume is 150 mΩ mm$^3$. Note that the converter footprint is 3 mm longer than 12 cells in each row to allow for input connections and end of row setbacks.

A comparable converter using the two-step interdependent cell and winding structure in the 3.75 mm×2.5 mm cell element footprint, may have a cell output resistance of approximately 10.4 mΩ, which in a 24 cell (12 column) converter provides an output resistance of approximately 0.43 mΩ, occupying a converter footprint of 33×8 mm, having a converter height of 2.7 mm, a converter area of 264 mm$^2$, and converter volume of 713 mm$^3$. The specific output resistance of such a converter based on area is 114 mΩ mm$^2$ and based on volume is 309 mΩ mm$^3$. As in the one-step variant, the converter footprint is 3 mm longer than 12 cells in each row to allow for input connections and end of row setbacks. Note that the two-step converter produces twice the output voltage, and in effect has twice the number of transformer turns in each output cell element, as the one-step converter and the single turn independent cell structure described above. Therefore, correcting for the effective number of transformer turns, the specific output resistance per turn of the two-step converter based on area is 57 mΩ mm$^2$ and based on volume is 154 mΩ mm$^3$ which compares favorably to the independent cell structure.

Comparing the above two examples, it is clear that the converter with the new cell structure reduces the specific output resistance by approximately 50%. However, the new converter used smaller FETs having a higher RDSON (lower figure of merit) to achieve a smaller footprint, which was enabled by the major improvement in the winding structure and represents a better balance between the winding resistance and switch resistance (RDSON) as components of output resistance.

Since the output resistance, and thus specific output resistance, of a converter can be influenced by other factors, such as duty cycle and choice of components, e.g. FETs, in the converter, to evaluate the relative advantages of different winding structures, it is therefore preferable to use "specific winding resistance", a figure of merit that excludes such other effects, e.g. component choices, e.g. FETs, capacitors, and operating parameters, e.g. duty cycle. The "specific winding resistance" as used herein is defined similar to specific output resistance above as the product of the AC winding resistance reflected to the output and volume (or area) and may also be calculated for the converter as a whole or on the basis of a cell or winding element.

For the above converter examples, the self-contained cell has an AC winding resistance of 3.0 mΩ for a single transformer turn in the 4.3 mm×3.5 mm cell footprint, yielding a specific winding resistance of 48 mΩ mm² per transformer turn at the cell level. The specific winding resistance of the converter based on area is 3.0/24*396=50 mΩ mm² and based on volume is 3.0/24*1068=134 mΩ mm³. By comparison the new one-step cell element has an AC winding resistance of 2.2 mΩ per transformer turn in the 3.75 mm×2.5 mm cell element footprint, yielding a specific winding resistance of 21 mΩ mm² per transformer turn at the cell level. At the converter level, the specific winding resistance based on area is 2.2/24*264=24 mΩ mm² and based on volume is 2.2/24*713=65 mΩ mm³. Note that the one-step specific winding resistance at both the cell and converter level is less than half that of the independent cell structure.

Similarly, the new two-step cell element has an AC winding resistance of 4.6 mΩ; but since this winding element supports twice the voltage (is the equivalent of two transformer turns), for proper comparison, the specific winding resistance should be divided by the square of the number of effective transformer turns. The specific winding resistance at the cell level 4.6*3.75*2.5=43 mΩ mm². At the converter level, the specific winding resistance based on area is 4.6/24*264=51 mΩ mm² and based on volume is 4.6/24*713=137 mΩ mm³. Note that the two-step specific winding resistance at both the cell and converter level is nearly the same as the prior art single turn cell even though the new two-step cell supports double the voltage. If compared based upon voltage, the two-step structure would have the advantage by a factor of four.

G. Multi-Output Converter Arrays

Output cell elements may be combined in various numbers and configurations to form a wide variety of multi-output converters. For example, cells having one-step winding elements and cells having two-step winding elements may be combined to provide different output voltages from the same or separate primary windings as needed to support different turns ratios or independent outputs. The number of output cell elements in each group, i.e. connected to support an output, may be scaled according to the load requirements. For example, a three-output converter may have three groups of output cells, e.g. a number, X1, of output cells in a first group connected to support a first output, a number, X2, of output cells in a second group connected to support a second output, and a number, X3, of output cells in a third group connected to support a third output. The primary windings of the first and second groups may be connected together either in series or parallel to drive the cells of the first and second groups together for outputs that track each other, and the primary winding of the third group may be independently driven to provide an independent output. If the primaries of the first and second groups are connected in series, (Np1=Np2=X1+X2), the turns ratio of each output cell would be greater than if connected in parallel (Np1=X1; Np2=X2). The groups may use winding elements having a number, $N_S$, of steps that is the same as, or different from, those in other groups, e.g. $N_S1=1$ for group 1, $N_S2=2$ for group 2, and $N_S3=3$ for group 3. Alternatively, the number of steps in the third group of cells may be the same as in one of the other groups, e.g. $N_S3=1$ for group 3. It will be appreciated that a wide range of converter configurations may be provided using the distributed output structure.

Figure 19:
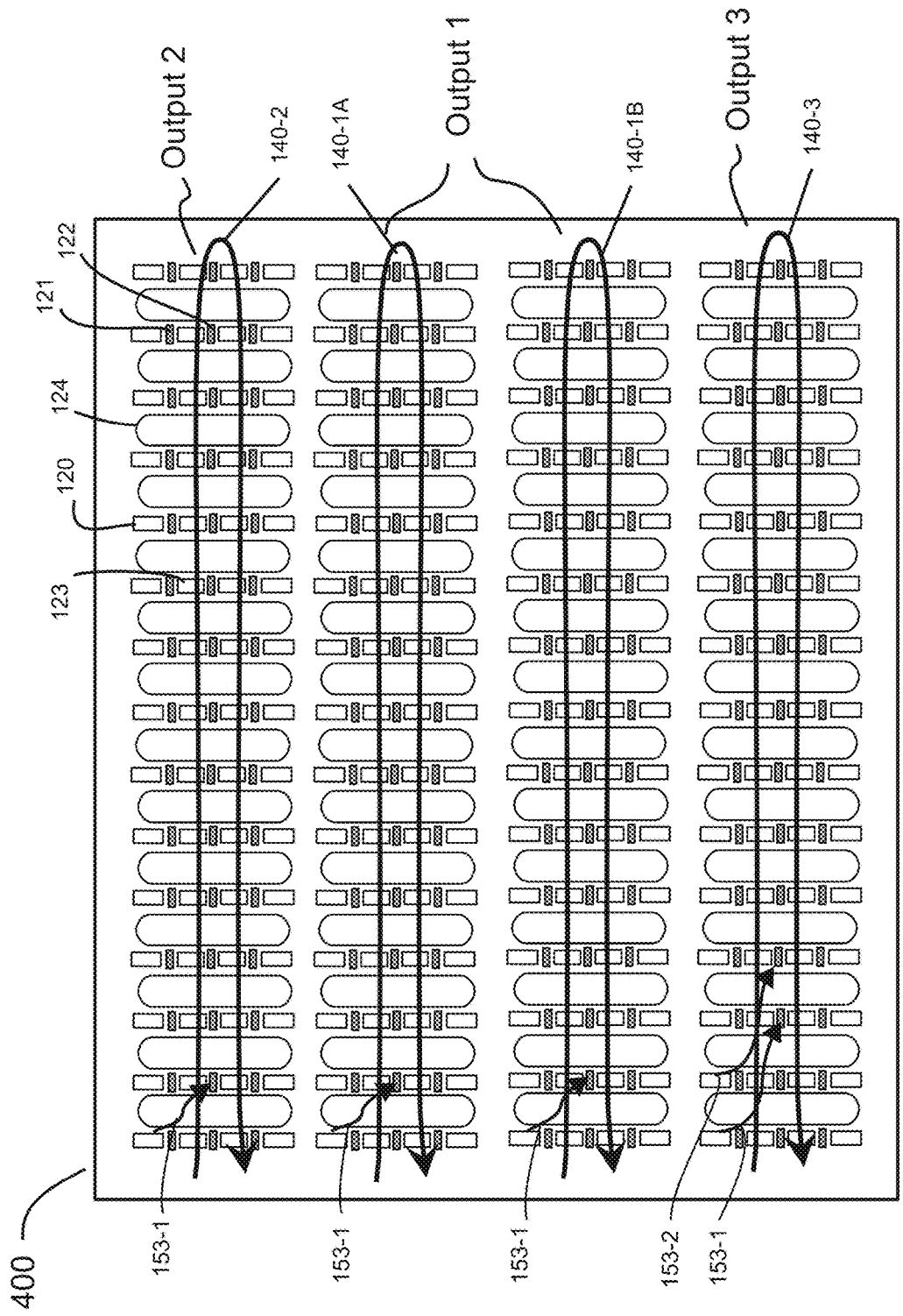
FIG. 19 shows a multi-output converter having an array of cell elements.

Referring to FIG. 19, an example of a three-output converter array 400 is shown having four rows of E-core elements 124 similar to those of the converter 100 in FIG. 4. Each row of E-core elements and the associated components, terminals, primary windings, and secondary winding elements may be essentially the same as those shown and described for the converter 100 in FIGS. 4-11, except that converter 400 includes 14 E-core elements in each row. Each of the 4 rows of 14 E-cores includes 28 output cells, for a total of 112 output cells. As shown in FIG. 19, the output cell elements in the middle two rows of E-cores (4 rows of 14 output cell elements each) are connected to support a first output; the output cell elements in the top row of E-cores (2 rows of 14 output cell elements each) may be connected to supply power to a second output; and the output cell elements in the bottom row of E-cores (2 rows of 14 output cell elements each) may be connected to supply power to a third output. The E-core elements in each row may be driven by a respective primary winding, e.g. four primary currents 140 (140-1A, 140-1B, 140-2, 140-3) are shown in FIG. 19. As described above, some or all of the primary windings may be connected together (in series or parallel) to provided outputs that track each other, or may be separately driven to provide one or more independent outputs as desired. In the example shown, the two central rows of E-cores (4 rows of 14 cells) may support a primary output of 0.8V at 900 A; the top row of E-cores (2 rows of 14 cells) may support a secondary independent output of 0.8V at 450 A; and the bottom row of E-cores (2 rows of 14 cells) may support a tertiary output of 1.5V at 300 A. As shown in FIG. 19, the output cells in the top three rows of E-cores use one-step winding elements as indicated by the secondary currents 153-1 in those rows and the output cells in the bottom row of E-cores may be configured using two-step winding elements as shown by the secondary currents 153-1 and 153-2 in that row. Although the above example shows the outputs partitioned by row, other portioning schemes are possible, e.g. partitioning by column or column and row.

A number of embodiments of the invention have been described. Nevertheless, it will be understood that various modifications may be made without departing from the spirit and scope of the invention. For example, each phase of each cell element may include multiple winding elements on multiple layers connected in parallel. Each output cell element may include winding elements coupling to a number, N, of magnetic loop paths, where N may be 1, 2, or greater. The cell elements may be physically arranged in a number of rows, preferably an even number of rows, e.g. 2, 4, or more rows. Other converter topologies may be used for the distributed output converter, e.g. multiphase buck converter topologies or switched capacitor converter topologies may be used, e.g. with each phase defining an individual output cell. Fixed ratio, regulating, or quasi-regulating topologies may be used. The distributed output converter described above is an example in which the driver and switch control circuitry are packaged separately, however the control and drive electronics also may be incorporated into the multi-cell converter. For example, the power converters described above can have a specific output resistance divided by $N_S$ that is different from the exemplary values provided above. In some examples, the specific output resistance divided by $N_S$ can be less than or equal to 90 mΩ mm² based upon area, or less than or equal to 200 mΩ mm³ based upon volume. In some examples, the specific output resistance divided by $N_S$ can be less than or equal to 60 mΩ mm² based upon area, or less than or equal to 140 mΩ mm³ based upon volume. For example, the power converters can have a specific winding resistance divided by $N_S$ that is different from the exemplary values provided above. In some examples, the specific winding resistance divided by $N_S$ can be less than or equal to 35 mΩ mm² based upon area, or less than or equal to 80 mΩ mm³ based upon volume. In some examples, the specific winding resistance divided by $N_S$ can be less than or equal to 30 mΩ mm² based upon area, or less than or equal to 70 mΩ mm³ based upon volume.

Accordingly, other embodiments are within the scope of the following claims.

What is claimed is:

1. An apparatus comprising:
   a power converter having a distributed output structure, the power converter including a multi-layer printed circuit board ("PCB") including a first conductive layer, a second conductive layer, and an insulation layer separating the first and second conductive layers;
   a magnetically permeable core structure including a number, Np, of magnetic paths, each passing through the first and second conductive layers in at least two leg locations;
   a first winding including a first winding element that passes through the Np magnetic paths between the respective leg locations, the first winding element being formed in the first conductive layer of the PCB;
   a plurality of second winding elements, each passing through a respective subset of the magnetic paths between the respective leg locations, each subset including a number, $N_S$, of the magnetic paths, the second winding elements being formed in the second conductive layer;
   a plurality of cell elements each including a switch and a capacitor, in which each cell element is associated with and includes at least a portion of a respective second winding element;
   wherein the respective second winding element associated with each cell element has a first end connected to a terminal of the switch in the cell element and a second end connected to an output terminal in a neighboring cell element, and the second winding elements in neighboring cell elements step through the respective subsets of magnetic paths in the same direction.

2. The apparatus of claim 1 wherein the cell elements are physically arranged in a step and repeat pattern.

3. The apparatus of claim 1 wherein the cell elements are connected to form one or more circular circuits.

4. The apparatus of claim 1 wherein the Np magnetic paths are arranged in pairs, each pair sharing a center leg as one of the leg locations.

5. The apparatus of claim 4 wherein the number $N_S$ equals 1; and the cell elements are arranged in a number of rows.

6. The apparatus of claim 5 wherein the number of rows equals two, and each row includes an equal number of cell elements.

7. The apparatus of claim 4 wherein the number $N_S$ equals 2; and the cell elements are arranged in a number of rows.

8. The apparatus of claim 7 wherein the number of rows equals two, and each row includes an equal number of cell elements.

9. The apparatus of claim 6 wherein the output terminals of the elements in one row are shared with the output terminals of the elements in the other row.

10. The apparatus of claim 1 wherein the cell elements are constructed and arranged with adjacent cells having interleaved magnetic paths, output terminals and/or switches.

11. An apparatus comprising:
    a power converter having a distributed output structure, the power converter including a multi-layer printed circuit board ("PCB") including a first conductive layer, a second conductive layer, and an insulation layer separating the first and second conductive layers;
    a magnetically permeable core structure including a number, Np, of magnetic paths, each passing through the first and second conductive layers in at least two leg locations;
    a first winding including a first winding element that passes through the Np magnetic paths between the respective leg locations, the first winding element being formed in the first conductive layer of the PCB;
    a plurality of second winding elements, each passing through a respective subset of the magnetic paths between the respective leg locations, each subset including a number, $N_S$, of the magnetic paths, the second winding elements being formed in the second conductive layer;
    a plurality of cell elements each including a switch and a capacitor, in which each cell element is associated with and includes at least a portion of a respective second winding element;
    wherein each second winding element comprises a length measured between a first termination and a second termination, the first termination is connected to the switch of the corresponding cell element, the switch is on one side of the corresponding subset of the magnetic paths, the second termination is connected to an output terminal located on an opposite side of the corresponding subset of the magnetic paths, and the length between the first and second terminations associated with cell elements not located at an end of the converter encircles less than half of the respective core leg in the second conductive layer.

12. An apparatus comprising:
    a power converter having a distributed output structure, the power converter including a multi-layer printed circuit board ("PCB") including a first conductive layer, a second conductive layer, and an insulation layer separating the first and second conductive layers;
    a magnetically permeable core structure including a number, Np, of magnetic paths, each passing through the first and second conductive layers in at least two leg locations;
    a first winding including a first winding element that passes through the Np magnetic paths between the respective leg locations, the first winding element being formed in the first conductive layer of the PCB;
    a plurality of second winding elements, each passing through a respective subset of the magnetic paths between the respective leg locations, each subset including a number, $N_S$, of the magnetic paths, the second winding elements being formed in the second conductive layer;

a plurality of interconnected converter output cell elements each including a switch and a capacitor, in which each converter output cell element is associated with and includes at least a portion of a respective second winding element;

wherein each second winding element comprises a length, $L_S$, measured between a first termination and a second termination, the first termination is connected to the switch of the corresponding output cell element, the switch is on one side of the corresponding subset of the magnetic paths, the second termination is connected to an output terminal located on an opposite side of the corresponding subset of the magnetic paths, wherein the length, $L_S$, divided by the average width, $W_S$, of the second winding element between the first and second terminations, and further divided by $N_S$, is less than a number of squares, S, per transformer turn; and wherein the number S is less than 6.

13. The apparatus of claim 12 wherein the number $N_S$ equals one, and the number S is less than or equal to 5.

14. The apparatus of claim 12 wherein the number $N_S$ equals two and the number S is less than or equal to 5.

15. The apparatus of claim 12 wherein S is 4 or less.

16. An apparatus comprising:

a power converter having a distributed output structure, the power converter including a multi-layer printed circuit board ("PCB") including a first conductive layer, a second conductive layer, and an insulation layer separating the first and second conductive layers;

a magnetically permeable E-core structure including a number, Np, of magnetic paths, each passing through the first and second conductive layers in at least two leg locations, the magnetic paths being arranged in a first set and a second set, each set forming a winding tunnel through the magnetic paths between the respective leg locations, the first set forming a first winding tunnel and the second set forming a second winding tunnel generally parallel to the first winding tunnel;

a first conductive winding including a first winding element passing through the first winding tunnel through the first set of magnetic paths in a first direction and through the second winding tunnel through the second set of magnetic paths in a direction opposite the first direction, the first conductive winding element being formed in the first conductive layer of the PCB;

a plurality of second winding elements, each passing through a respective subset of the magnetic paths between the respective leg locations, each subset including a number, $N_S$, of the magnetic paths, the second winding elements being formed in the second conductive layer;

a plurality of interconnected converter output cell elements each including a switch and a capacitor, in which each converter output cell element is associated with and includes at least a portion of a respective second winding element;

wherein the respective second winding element associated with each cell element has a first end connected to a terminal of the switch in the cell element and a second end connected to an output terminal in a neighboring cell element and the second winding elements in neighboring cell elements step through the respective subsets of magnetic paths in the same direction.

17. The apparatus of claim 16 wherein the output cell elements are constructed and arranged with adjacent cells having interleaved magnetic paths, output terminals and/or switches.

18. An apparatus comprising: a power converter having a distributed output structure, the power converter including a multi-layer printed circuit board ("PCB") including a first conductive layer, a second conductive layer, and an insulation layer separating the first and second conductive layers; a magnetically permeable core structure including a number, Np, of magnetic paths, each passing through the first and second conductive layers in at least two leg locations; a first winding including a first winding element that passes through the Np magnetic paths between the respective leg locations, the first winding element being formed in the first conductive layer of the PCB; a plurality of second winding elements, each passing through a respective subset of the magnetic paths between the respective leg locations, each subset including a number, $N_S$, of the magnetic paths, the second winding elements being formed in the second conductive layer; a plurality of cell elements each including a switch and a capacitor, in which each cell element is associated with and includes at least a portion of a respective second winding element; wherein the respective second winding element associated with each cell element has a first end connected to a terminal of the switch in the cell element and a second end connected to an output terminal in a neighboring cell element and the second winding elements in neighboring cell elements step through the respective subsets of magnetic paths in the same direction, wherein the converter comprises a specific output resistance divided by $N_S$ that is less than or equal to 90 m$\Omega$ mm$^2$ based upon area, or less than or equal to 200 m$\Omega$ mm$^2$ based upon volume.

19. The apparatus of claim 18 wherein the converter comprises a specific winding resistance divided by $N_S$ that is less than or equal to 35 m$\Omega$ mm$^2$ based upon area or less than or equal to 80 m$\Omega$ mm$^3$ based upon volume.

20. The apparatus of claim 18 wherein the converter comprises a specific winding resistance divided by $N_S$ that is less than or equal to 30 m$\Omega$ mm$^2$ based upon area or less than or equal to 70 m$\Omega$ mm$^3$ based upon volume.

21. The apparatus of claim 18 wherein the converter comprises a specific output resistance divided by $N_S$ that is less than or equal to 60 m$\Omega$ mm$^2$ based upon area or less than or equal to 140 m$\Omega$ mm$^3$ based upon volume.

22. The apparatus of claim 18 wherein each magnetic path surrounds one secondary winding element in the second conductive layer.

23. The apparatus of claim 18 wherein each magnetic path surrounds two secondary winding elements in the second conductive layer.

24. The apparatus of claim 18 wherein each magnetic path surrounds a number of secondary winding elements in the second conductive layer, wherein the number equals $N_S$.

25. The apparatus of claim 18 further comprising a number, X, of first windings each including a respective first winding element that passes through a respective subset of the magnetic paths between the respective leg locations, each respective subset including a respective number, Npx, of the magnetic paths; and wherein the cell elements are arranged in two or more groups, each group connected to support a respective converter output.

26. The apparatus of claim 25 wherein the cell elements are arranged in a number of rows and the magnetic paths are arranged in pairs.

27. The apparatus of claim 26 wherein the number $N_S$ equals 1 for the cell elements in a first group and $N_S=2$ for the cell elements in a second group.

28. The apparatus of claim 26 wherein the groups of cell elements are partitioned by row.

29. The apparatus of claim 26 wherein the groups of cell elements are partitioned by column.

30. The apparatus of claim 26 wherein the groups of cell elements are partitioned across rows and columns.

31. An apparatus comprising:
a power converter having a distributed output structure, the power converter including a multi-layer printed circuit board ("PCB") including a first conductive layer, a second conductive layer, and an insulation layer separating the first and second conductive layers;
a magnetically permeable core structure including a number, Np, of magnetic paths, each passing through the first and second conductive layers in at least two leg locations;
a number, X, of first windings each including a respective first winding element that passes through a respective subset of the magnetic paths between the respective leg locations, each respective subset including a respective number, Npx, of the magnetic paths, at least one of the first winding elements being formed in the first conductive layer of the PCB;
a plurality of second winding elements, each passing through a respective subset of the magnetic paths between the respective leg locations, each subset including a number, $N_S$, of the magnetic paths, the second winding elements being formed in the second conductive layer;
a plurality of cell elements each including a switch and a capacitor, in which each cell element is associated with and includes at least a portion of a respective second winding element;
wherein the respective second winding element associated with each cell element has a first end connected to a terminal of the switch in the cell element and a second end connected to an output terminal in a neighboring cell element, and the second winding elements in neighboring cell elements step through the respective subsets of magnetic paths in the same direction; and
wherein the cell elements are arranged in two or more groups, each group connected to support a respective converter output.

32. The apparatus of claim 11 wherein the cell elements are physically arranged in a step and repeat pattern.

33. The apparatus of claim 11 wherein the cell elements are connected to form one or more circular circuits.

34. The apparatus of claim 11 wherein the Np magnetic paths are arranged in pairs, each pair sharing a center leg as one of the leg locations.

35. The apparatus of claim 34 wherein the number $N_S$ equals 1; and the cell elements are arranged in a number of rows.

36. The apparatus of claim 35 wherein the number of rows equals two, and each row includes an equal number of cell elements.

37. The apparatus of claim 34 wherein the number $N_S$ equals 2; and the cell elements are arranged in a number of rows.

38. The apparatus of claim 37 wherein the number of rows equals two, and each row includes an equal number of cell elements.

39. The apparatus of claim 36 wherein the output terminals of the elements in one row are shared with the output terminals of the elements in the other row.

40. The apparatus of claim 11 wherein the cell elements are constructed and arranged with adjacent cells having interleaved magnetic paths, output terminals and/or switches.

41. The apparatus of claim 12 wherein the cell elements are physically arranged in a step and repeat pattern.

42. The apparatus of claim 12 wherein the cell elements are connected to form one or more circular circuits.

43. The apparatus of claim 12 wherein the Np magnetic paths are arranged in pairs, each pair sharing a center leg as one of the leg locations.

44. The apparatus of claim 43 wherein the number $N_S$ equals 1; and the cell elements are arranged in a number of rows.

45. The apparatus of claim 44 wherein the number of rows equals two, and each row includes an equal number of cell elements.

46. The apparatus of claim 43 wherein the number $N_S$ equals 2; and the cell elements are arranged in a number of rows.

47. The apparatus of claim 46 wherein the number of rows equals two, and each row includes an equal number of cell elements.

48. The apparatus of claim 45 wherein the output terminals of the elements in one row are shared with the output terminals of the elements in the other row.

49. The apparatus of claim 12 wherein the cell elements are constructed and arranged with adjacent cells having interleaved magnetic paths, output terminals and/or switches.

50. The apparatus of claim 16 wherein the cell elements are physically arranged in a step and repeat pattern.

51. The apparatus of claim 16 wherein the cell elements are connected to form one or more circular circuits.

52. The apparatus of claim 16 wherein the Np magnetic paths are arranged in pairs, each pair sharing a center leg as one of the leg locations.

53. The apparatus of claim 52 wherein the number $N_S$ equals 1; and the cell elements are arranged in a number of rows.

54. The apparatus of claim 53 wherein the number of rows equals two, and each row includes an equal number of cell elements.

55. The apparatus of claim 52 wherein the number $N_S$ equals 2; and the cell elements are arranged in a number of rows.

56. The apparatus of claim 55 wherein the number of rows equals two, and each row includes an equal number of cell elements.

57. The apparatus of claim 54 wherein the output terminals of the elements in one row are shared with the output terminals of the elements in the other row.

58. The apparatus of claim 31 wherein the cell elements are physically arranged in a step and repeat pattern.

59. The apparatus of claim 31 wherein the cell elements are connected to form one or more circular circuits.

60. The apparatus of claim 31 wherein the Np magnetic paths are arranged in pairs, each pair sharing a center leg as one of the leg locations.

61. The apparatus of claim 60 wherein the number $N_S$ equals 1; and the cell elements are arranged in a number of rows.

62. The apparatus of claim 61 wherein the number of rows equals two, and each row includes an equal number of cell elements.

63. The apparatus of claim 60 wherein the number $N_S$ equals 2; and the cell elements are arranged in a number of rows.

64. The apparatus of claim 63 wherein the number of rows equals two, and each row includes an equal number of cell elements.

65. The apparatus of claim 62 wherein the output terminals of the elements in one row are shared with the output terminals of the elements in the other row.

66. The apparatus of claim 31 wherein the cell elements are constructed and arranged with adjacent cells having interleaved magnetic paths, output terminals and/or switches.

67. The apparatus of claim 31 wherein the number X is at least 2, the cell elements are arranged in at least a first group and a second group, the first group of cell elements are connected to support a first converter output, and the second group of cell elements are connected to support a second converter output.

68. The apparatus of claim 67 wherein the number X is at least 3, the cell elements are arranged in at least a first group, a second group, and a third group, wherein the first group of cell elements are connected to support a first converter output, the second group of cell elements are connected to support a second converter output, and the third group of cell elements are connected to support a third converter output.

69. The apparatus of claim 67 wherein the plurality of cell elements are arranged in a number of rows, the first group of cell elements are arranged in two rows of cell elements, and the second group of cell elements are arranged in two rows of cell elements.

70. The apparatus of claim 69 wherein the first group of cell elements has the same number of cell elements as the second group of cell elements.

71. The apparatus of claim 67 wherein the plurality of cell elements are arranged in a number of rows, the first group of cell elements are arranged in a first number of rows of cell elements, the second group of cell elements are arranged in a second number of rows of cell elements, and second number of rows is different from the first number of rows.

72. The apparatus of claim 71 wherein the first number of rows is equal to two rows, the second number of rows is equal to four rows.

73. The apparatus of claim 72 wherein the second group of cell elements has approximately twice the number of cell elements in the first group of cell elements, the first converter output is configured to support a first output voltage at a first output current, the second converter output is configured to support a second output voltage at a second output current, the second output voltage is substantially the same as the first output voltage, and the second output current is substantially equal to twice the first output current.

74. The apparatus of claim 67 wherein the first converter output is configured to support a first output voltage at a first output current, the second converter output is configured to support a second output voltage at a second output current, the second output voltage is higher than the first output voltage, and the second output current is lower than the first output current.

75. The apparatus of claim 31 wherein the plurality of cell elements are arranged in a plurality of rows and a plurality of columns, the number X is at least 2, the cell elements are partitioned by column, the cell elements are arranged in at least a first group and a second group, the cell elements in a same column belong to a same group, the first group of cell elements comprise at least one column of cell elements, the second group of cell elements comprise at least one column of cell elements, the first group of cell elements are connected to support a first converter output, and the second group of cell elements are connected to support a second converter output.

76. The apparatus of claim 31 wherein the plurality of cell elements are arranged in a plurality of rows and a plurality of columns, the number X is at least 2, the cell elements are partitioned by row and column, the cell elements are arranged in at least a first group and a second group, the first group of cell elements are connected to support a first converter output, and the second group of cell elements are connected to support a second converter output.

* * * * *

UNITED STATES PATENT AND TRADEMARK OFFICE
CERTIFICATE OF CORRECTION

PATENT NO. : 11,271,490 B1
APPLICATION NO. : 16/535480
DATED : March 8, 2022
INVENTOR(S) : Patrizio Vinciarelli It is certified that error appears in the above-identified patent and that said Letters Patent is hereby corrected as shown below:

In the Specification

Column 17, Line 5, delete "width, W. i.e." and insert -- width, W, i.e. --.

Column 20, Line 66, delete "RDSON" and insert -- $R_{DSON}$ --.

Column 21, Line 3, delete "(RDSON)" and insert -- ($R_{DSON}$) --.

In the Claims

Column 26, Line 34, in Claim 18, delete "$mm^2$" and insert -- $mm^3$ --.

Signed and Sealed this
Twentieth Day of September, 2022

Katherine Kelly Vidal
*Director of the United States Patent and Trademark Office*